(12) United States Patent
Zheng et al.

(10) Patent No.: US 11,659,778 B2
(45) Date of Patent: May 23, 2023

(54) COMPOSITE ELECTRODE MATERIAL CHEMISTRY

(71) Applicant: Micron Technology, Inc., Boise, ID (US)

(72) Inventors: Pengyuan Zheng, Boise, ID (US); Enrico Varesi, Milan (IT); Lorenzo Fratin, Buccinasco (IT); Dale Collins, Boise, ID (US); Yongjun J. Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 338 days.

(21) Appl. No.: 16/788,204

(22) Filed: Feb. 11, 2020

(65) Prior Publication Data

US 2021/0249598 A1  Aug. 12, 2021

(51) Int. Cl.
| | | |
|---|---|---|
| *H01L 45/00* | (2006.01) | |
| *C23C 14/06* | (2006.01) | |
| *C23C 14/34* | (2006.01) | |
| *H01L 27/24* | (2006.01) | |

(52) U.S. Cl.
CPC ...... *H01L 45/1253* (2013.01); *C23C 14/0635* (2013.01); *C23C 14/34* (2013.01); *H01L 27/2481* (2013.01); *H01L 45/06* (2013.01); *H01L 45/1233* (2013.01); *H01L 45/141* (2013.01); *H01L 45/16* (2013.01)

(58) Field of Classification Search
CPC ........................................................ H01L 27/24
See application file for complete search history.

(56) References Cited

U.S. PATENT DOCUMENTS

| | | |
|---|---|---|
| 9,299,747 B1 | 3/2016 | Pellizzer et al. |
| 9,419,212 B2 | 8/2016 | Petz et al. |
| 9,543,515 B2 | 1/2017 | Gealy et al. |
| 9,741,930 B2 | 8/2017 | Soncini et al. |
| 10,008,667 B2 | 6/2018 | Fumagalli et al. |
| 2016/0093804 A1 | 3/2016 | Petz et al. |
| 2020/0136036 A1* | 4/2020 | Wu ............... H01L 45/1683 |

* cited by examiner

*Primary Examiner* — Mounir S Amer
(74) *Attorney, Agent, or Firm* — Holland & Hart LLP

(57) ABSTRACT

Methods, systems, and devices for composite electrode material chemistry are described. A memory device may include an access line, a storage element comprising chalcogenide, and an electrode coupled with the memory element and the access line. The electrode may be made of a composition of a first material doped with a second material. The second material may include a tantalum-carbon compound. In some cases, the second may be operable to be chemically inert with the storage element. The second material may include a thermally stable electrical resistivity and a lower resistance to signals communicated between the access line and the storage element across a range of operating temperatures of the storage element as compared with a resistance of the first material.

7 Claims, 9 Drawing Sheets

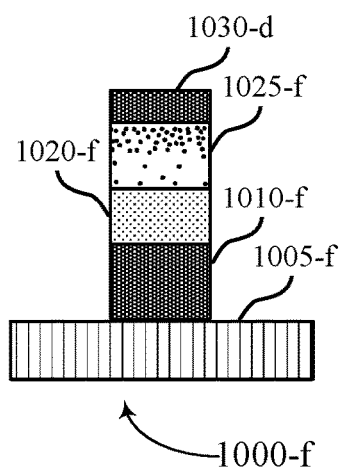
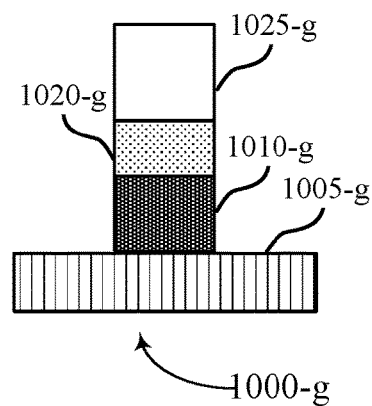
FIG. 10F  FIG. 10G
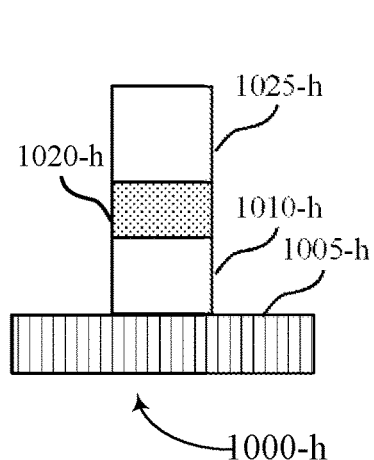
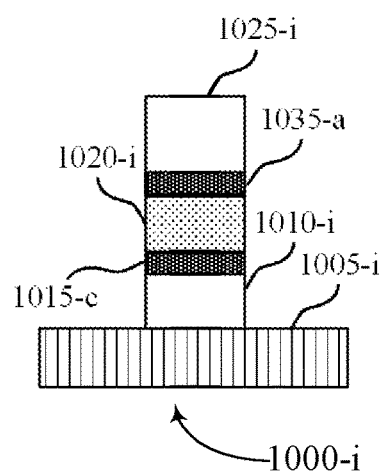
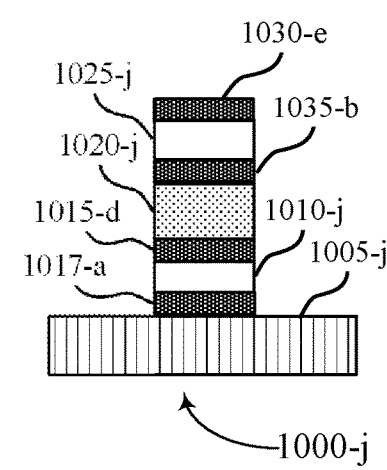
FIG. 10H  FIG. 10I  FIG. 10J

COMPOSITE ELECTRODE MATERIAL CHEMISTRY

BACKGROUND

The following relates generally to one or more memory systems and more specifically to composite electrode material chemistry.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

BRIEF DESCRIPTION OF THE DRAWINGS

FIGS. 10A-J illustrate examples of a memory device that supports composite electrode material chemistry in accordance with examples as disclosed herein.

DETAILED DESCRIPTION

Chalcogenide material compositions may be used in components or elements of memory devices that use chalcogenide materials to form storage elements. In some cases, memory cells with chalcogenide-based materials may experience high temperatures during operation and large-temperatures swings. Chalcogenide materials that have a higher tendency for large-temperatures swings may limit the usefulness and performance of devices employing those compositions. For example, changes in temperature may affect the resistivity of electrodes coupled with the chalcogenide material. In some examples, affecting the resistivity of the electrodes may change the chemical bonding between the chalcogenide material and the material of the electrode, thereby causing the chalcogenide material to mix with the material of the electrode. In such cases, the effectiveness of the chalcogenide material and overall performance of the memory device may decrease.

The effects of changes in temperature and resistivity change of the electrode may be mitigated by introducing an element into the material of the electrode that increases stability. For example, the electrode may be formed of a composition of material that includes a tantalum-carbon compound. The material that includes the tantalum-carbon compound may be chemically inert relative to the chalcogenide-based storage element. In some examples, the material that includes the tantalum-carbon compound may exhibit a relatively constant resistivity across a range of temperatures that the chalcogenide-based material may operate (e.g., increasing temperatures). The material may include a tunable resistivity during a manufacturing process. The material may include an increasing thermal stability and a thermally stable electrical resistivity, thereby increasing the effectiveness and overall performance of the memory device. Incorporating a tantalum-carbon compound into the material composition of the electrode may stabilize the memory device to allow for technology scaling and increased cross point technology development (e.g., three-dimensional cross point architectures, random access memory (RAM) deployments, storage deployments, or the like).

Features of the disclosure are initially described in the context of a system, a memory die, and memory cells as described with reference to FIGS. 1-3. Features of the disclosure are described in the context of diagrams as described with reference to FIGS. 4-10. These and other features of the disclosure are further illustrated by and described with reference to a flowchart that relates to composite electrode material chemistry as described with references to FIG. 11.

Figure 1:
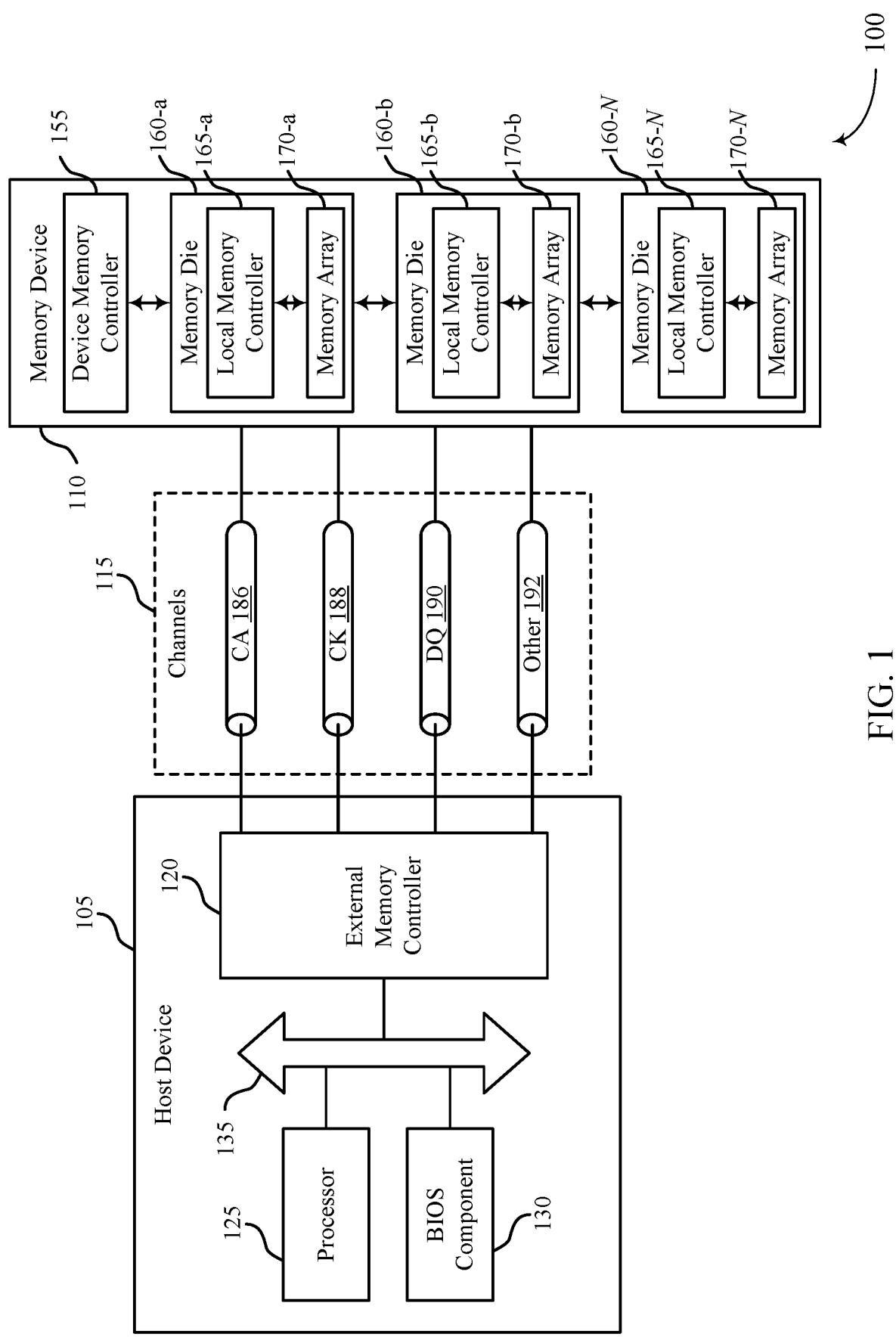
FIG. 1 illustrates an example of a system that supports composite electrode material chemistry in accordance with examples as disclosed herein.

FIG. 1 illustrates an example of a system 100 that supports composite electrode material chemistry in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die may include an electrode with composite material chemistry. In some cases, the composition of the electrode of the non-volatile phase change memory cells may have beneficial properties that may result in improved performance relative to other memory architectures. For example, incorporating a tantalum-carbon compound into the material of the electrode may increase the performance of the memory device by allowing a tunable resistivity of the electrode during the manufacturing process of the electrode material. In such cases, the electrode may provide a lower resistance to signals communicated between the access line and the memory element across a range of operating temperatures of the storage element as compared with a resistance of an electrode without the tantalum-carbon compound. In some cases, the material including the tantalum-carbon compound may be chemically inert with the storage element of the memory element, thereby increasing the effectiveness of the storage element.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a row line or column line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
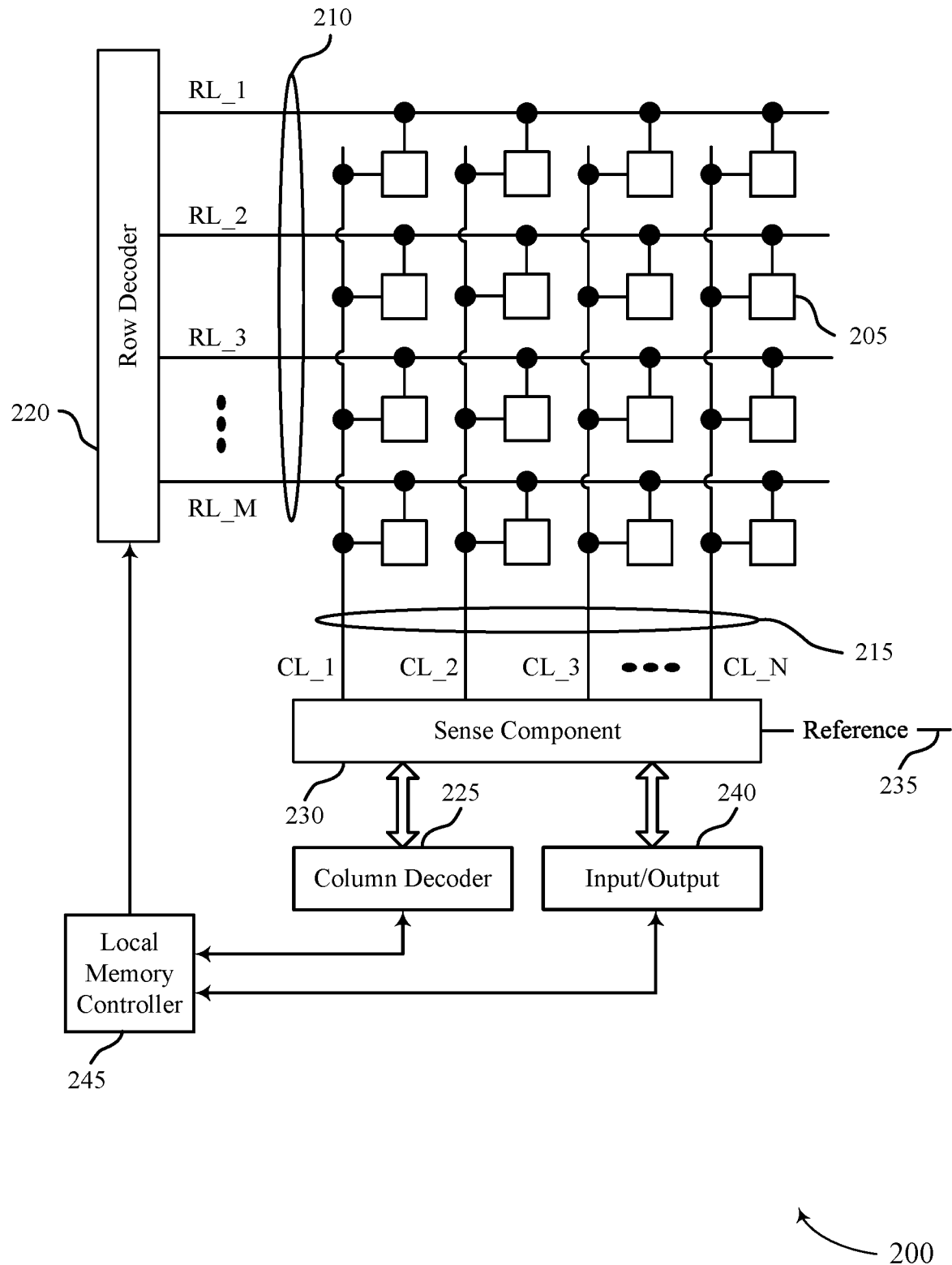
FIG. 2 illustrates an example of a memory die that supports composite electrode material chemistry in accordance with examples as disclosed herein.

FIG. 2 illustrates an example of a memory die 200 that supports composite electrode material chemistry in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell. In some cases, the material of the electrode in contact with the chalcogenide storage element may be configured to be chemically inert with the material of the chalcogenide storage element of the memory cell 205.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 260 and activate a row line 210 based on the received row address. A column decoder 225 may receive a column address from the local memory controller 260 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 260 may control the accessing of memory cells 205 through the various components (e.g., row decoder 220, column decoder 225, sense component 230). The local memory controller 260 may be an example of the local memory controller 165 described with reference to FIG. 1. In some examples, one or more of the row decoder 220, column decoder 225, and sense component 230 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target row line 210 and the target column line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

Figure 3:
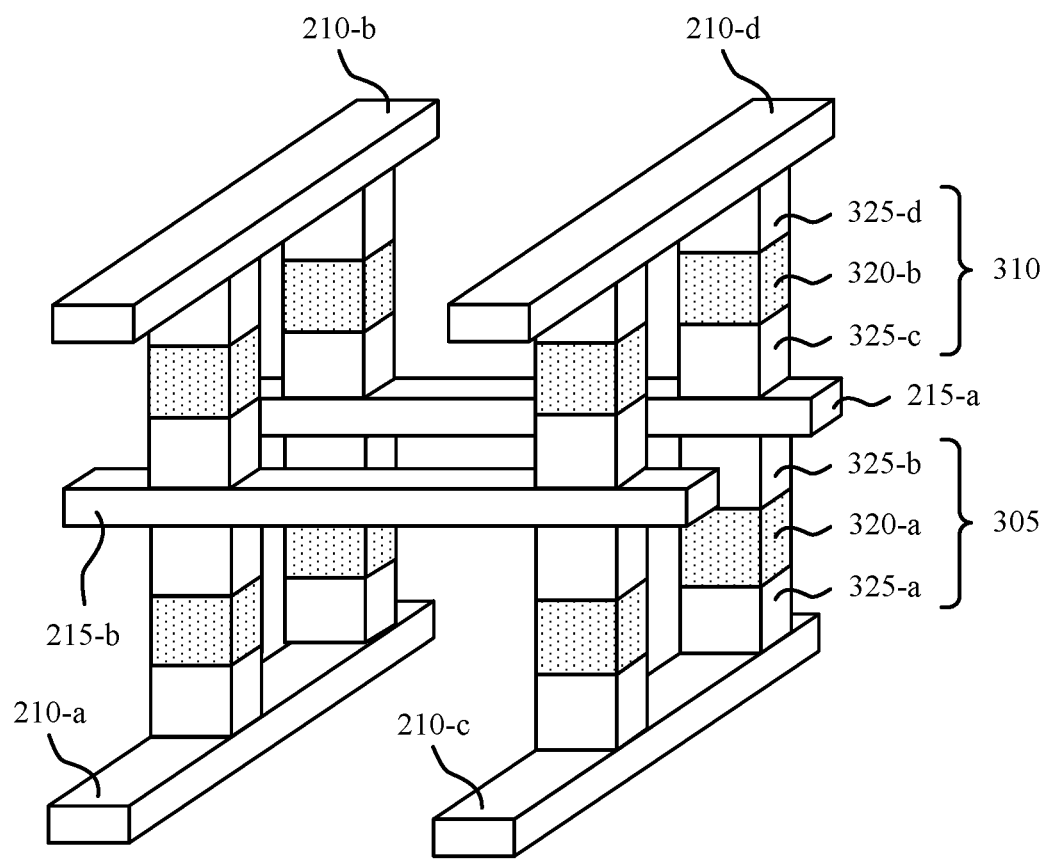
FIG. 3 illustrates an example of memory cells that support composite electrode material chemistry in accordance with examples as disclosed herein.

FIG. 3 illustrates an example of memory cells that support composite electrode material chemistry in accordance with examples as disclosed herein. Memory array 300 may be an example of portions of the memory arrays or memory dies described with reference to FIGS. 1 and 2. The memory array 300 may include a first deck 305 of memory cells that is positioned above a substrate and second deck 310 of memory cells on top of the first array or deck 305. Though the example of memory array 300 includes two decks 305, 310, the memory array 300 may include any quantity of decks (e.g., one or more than two).

Memory array 300 may also include a row line 210-a, a row line 210-b, a row line 210-c, a row line 210-d, a column line 215-a, and a column line 215-b, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 305 may include one or more of an electrode 325-a, a storage element 320-a, or an electrode 325-b. One or more memory cells of the second deck 310 may include an electrode 325-c, a storage element 320-b, and an electrode 325-d. The storage elements 320 may be examples of a chalcogenide material, such as a phase change storage element, a thresholding storage element, or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-c of the second deck 310 and the second electrode 325-b of the first deck 305 may be coupled with column line 215-a such that the column line 215-a may be shared by vertically adjacent memory cells.

In some cases, electrode 325-a, electrode 325-b, electrode 325-c, electrode 325-d, or a combination thereof may include a tantalum-carbon compound. The material of electrode 325-a, electrode 325-b, or both may be chemically inert with the storage element 320-a. The material of electrode 325-c, electrode 325-d, or both may be chemically inert with the storage element 320-b. In some examples, the material of electrode 325-a, electrode 325-b, or both may provide a lower resistance to signals communicated between the access line (e.g., row line 210-c and column line 215-a) and the storage element 320-a across a range of operating temperatures of the storage element 320-a as compared with a resistance of the material of electrode 325-a, electrode 325-b, or both without the tantalum-carbon compound. In some examples, the material of electrode 325-c, electrode 325-d, or both may provide a lower resistance to signals communicated between the access line (e.g., column line 215-a and row line 210-d) and the storage element 320-b across a range of operating temperatures of the storage element 320-b as compared with a resistance of a material of electrode 325-c, electrode 325-d, or both without the tantalum-carbon compound.

In some examples, the material of the storage element 320 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, the storage element 320 may be an example of a phase change memory cell. In such examples, the material used in the storage element 320 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration).

Phase change memory cells may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance.

The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance may be of some value between the resistances of the material in a wholly crystalline or wholly amorphous state. In such examples, a material may be used to store more than two logic states (e.g., three or more logic states).

During a programming (write) operation of a phase change memory cell (e.g., electrode 325-a, storage element 320-a, electrode 325-b), the various parameters of the programming pulse may influence (e.g., determine, set, program) a particular behavior or characteristic of the material of the storage element 320, such as the threshold voltage of the material or the resistance of the material. To program a low-resistance state (e.g., a relatively crystalline state) in the phase change memory cell, a programming pulse may be applied that heats or melts the material of the storage element 320, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state. To program a high-resistance state (e.g., a relatively amorphous state) in the phase change memory cell, a programming pulse may be applied that heats and/or melts the material of the storage element 320. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element 320 depending on the logic state stored by the material of the storage element 320 may correspond to the sense window of the storage element 320.

In some cases, a portion of a storage element may undergo a material change associated with the logic states.

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 320 may be an example of a self-selecting memory cell. In such examples, the material used in the storage element 320 may be an alloy (such as the alloys listed above) and may be operated so as to not undergo a phase change (e.g., may not undergo a change between a relatively crystalline state and a relatively amorphous state) during normal operation of the memory cell. For example, the material of the storage element 320 may include a chemical element, such as arsenic, that inhibits the chalcogenide material from changing states and thus may remain in a single state (e.g., an amorphous state or a crystalline state). In some examples, such as for self-selecting memory cells, some or all of the set of logic states supported by the memory cells may be associated with an amorphous state of the chalcogenide material (e.g., the material in a single state may be operable to store different logic states). For example, a logic state '0' and a logic state '1' may both be associated with an amorphous state of the chalcogenide material.

During a programming (write) operation of a self-selecting memory cell (e.g., including electrode 325-a, storage element 320-a, and electrode 325-b), a polarity used for a write operation may influence (determine, set, program) a particular behavior or characteristic of the material of the storage element 320, such as the threshold voltage of the material. The difference in threshold voltages of the material of the storage element 320 depending on the logic state stored by the material of the storage element 320 (e.g., the difference between the threshold voltage when the material is storing a logic state '0' versus a logic state '1') may correspond to the sense window of the storage element 320.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but need not be in a pillar or stack configuration).

Figure 4:
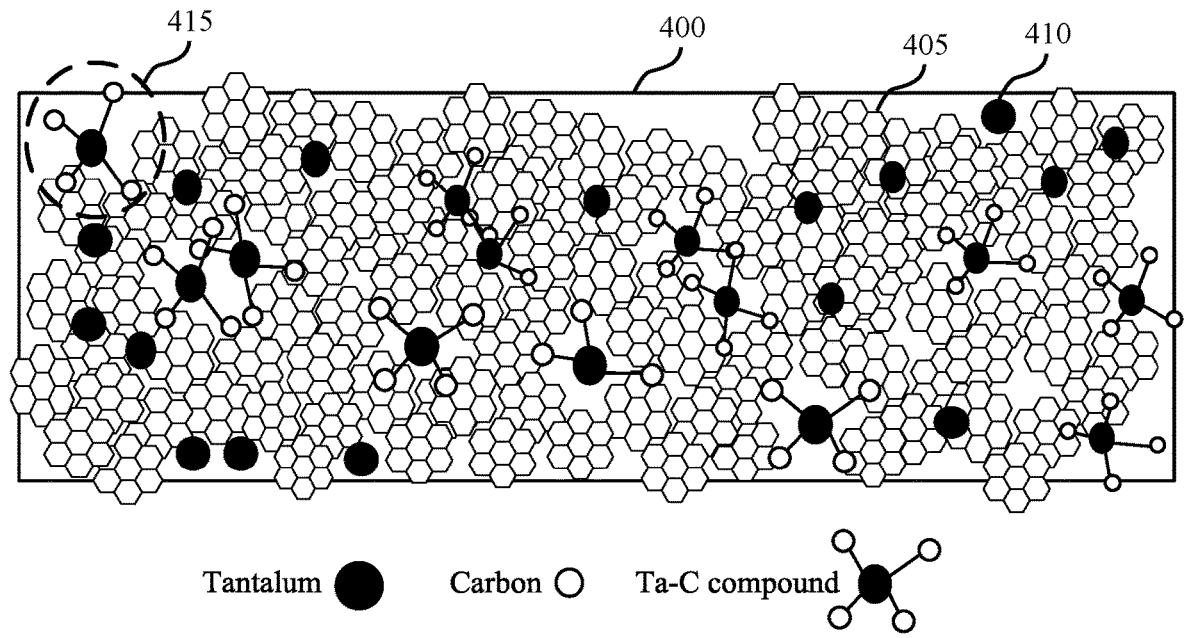
FIG. 4 illustrates an example of a composition that supports composite electrode material chemistry in accordance with examples as disclosed herein.

FIG. 4 illustrates an example of a material 400 that supports composite electrode material chemistry in accordance with examples as disclosed herein. Material 400 may include carbon 405, tantalum 410, and a tantalum-carbon compound 415. In some cases, material 400 may an example material of an electrode (e.g., electrode 325 described with reference to FIG. 3). Material 400 may include a composite, a doped material, a composition, or a combination thereof.

In some systems, a pure carbon electrode may result in a nonrecoverable resistivity through a heat cycle (e.g., changing temperatures). In some cases, the electrical resistivity of the electrode may be based on the temperature. Chalcogenide-based storage elements may operate at a range of temperatures during normal operation. As the temperatures varies, the resistivity of the electrode may vary, which may affect the performance of the memory device more generally. A reduction in resistivity may not be recovered if the pure carbon electrode reaches a temperature higher than a deposition temperature of pure carbon. For example, as the temperature of the electrode is increased and then decreased repeatedly, the resistivity of the carbon electrode may decrease over time. Once the electrode reaches the temperature range of 400-500 degree Celsius, the resistivity of the carbon electrode may be maintained at the corresponding resistivity until the electrode is heated above the temperature range of 400-500 degree Celsius.

During the temperature range of 400-500 degree Celsius, seasoning may occur. Seasoning may be an example of a time and current required to reach a stable threshold voltage of the memory cell and/or a stable resistivity of the electrode. For example, when the memory cell is first manufactured the temperature changes cause several changes initially, and the memory cell gets "seasoned" or reaches a steady state of performance after extended use. In some cases, a change in resistivity may contribute to increased costs and decreased reliability of the memory cell. In other examples, the change in resistivity of the electrode may produce inconsistent thermal annealing and spike current effect during seasoning, thereby contributing to a change in the voltage threshold through cycling. In some cases, the change in resistivity may cause a change in the threshold voltage during operation cycling. Cycling may be an example of program cycling that may change the threshold voltage when programming the memory cell.

In some cases, a top electrode and bottom electrode of thermally stable electrical resistivity at a desired low resistivity range may be used for efficient seasoning (e.g., reduced seasoning current and cycles) to reduce the voltage threshold difference. In some cases, manufacturing and production costs may be reduced by reducing seasoning cycle times. However, an electrode comprising carbon or carbon nitride material with similar properties may contribute to cell material damage due to a high temperature dependence and high bias process in order to obtain lower resistive carbon or carbon nitride based electrode. In some cases, the temperature dependence and thermal evolution of the carbon and carbon nitride based electrode resistivity may contribute to a change in the voltage threshold through cycling. The electrode may serve as a protection element for the memory element from cell material damage. Thus, an improvement to the material and properties of the electrode may be desired.

In some examples, a material 400 of the electrode may include carbon 405, tantalum 410, and a tantalum-carbon compound 415 (e.g., carbon 405 forms a bond with tantalum 410). For example, the first material (e.g., carbon 405 and tantalum 410) may be doped with the tantalum-carbon compound 415 to form a second material. In other examples, the material 400 of the electrode may include carbon 405 and the tantalum-carbon compound 415. For example, the first material (e.g., carbon 405) may be doped with the tantalum-carbon compound 415 to form the second material.

The carbon 405 may be an example of amorphous carbon. The electrical resistivity of material 400 may be thermally stable (e.g., high stability under electro-thermal stress) due to the opposite thermal dependence of tantalum 410 and carbon 405. For example, the opposite thermal dependence may be an example of a different temperature dependence of resistivity for tantalum 410 and carbon 405. The material 400 may also be thermally stable due to the resistivity of carbon 405 and the different electrical resistivity ranges (e.g., 100-5000 uOhm cm) of carbon 405. For example, the material 400 may include a stable resistivity across a range of operating temperatures. In such cases, the material 400 may include a metal (e.g., tantalum 410) or metallic carbide (e.g., tantalum-carbon compound 415) with a low resistivity (e.g., 10-100 uOhm-cm).

The material 400 may be chemically inert with the material of the memory element while allowing for thermal stability and reduced resistivity. For example, the carbon 405 may enable the material 400 to be chemically inert with the material of the memory element. The material 400 may be chemically stable so as to prevent a reaction with cell material (e.g., chalcogenide material of the memory element). As the temperature of the memory cell increases (e.g., during a programming pulse), the cell material may become increasingly reactive. The absence of carbon 405 may result in a reaction between the material of the electrode and the material of the memory element. In such cases, the memory device may form new compounds based on the reaction, thereby changing the electrical properties the cell material, changing the resistivity, and changing the volume of the cell material. In such cases, the cell material may lose the ability to store data and decrease the efficiency of the memory device. Therefore, the presence of carbon 405 within material 400 may extend the localization of electrons, thereby increasing conductivity and the overall performance of the memory device.

The material 400 may provide a lower resistance to signals communicated between the access line and the memory element across a range of operating temperatures of the memory element as compared to a resistance of a composition without the tantalum-carbon compound 415. To provide the low resistance to signals, the material 400 may include an increased amount of tantalum 410 relative to the carbon 405 for reduced resistance. In some examples, the material 400 may include a majority amount of carbon 405 relative to the tantalum 410. In some cases, the ratio of carbon to tantalum may be 1:1 or 2:1, or much more (e.g., tantalum may comprise 2%, 2.5%, 3%, 3.5%, 4%, 4.5%, 5%, 5.5%, 6%, 6.5% or other percentages of the composition). The material 400 (e.g., carbon 405) may be tuned by the addition of tantalum 410 in order to modulate the resistivity of the material 400. The material 400 including a combination of carbon 405 and the tantalum-carbon compound 415 may allow for a tunable resistivity across operating temperatures of the memory device during the manufacturing process to provide optimal resistivity characteristics at different operating temperatures during operation. In such cases, the material 400 may be formed that has a desired resistivity for operation.

In some cases, an amount of tantalum 410 may vary in the material 400. For example, the tantalum-carbon compound 415 may be in an amount less than or equal to 10 atomic percent (at. %) of the material 400. The tantalum-carbon compound 415 may be in an amount less than or equal to 94.8 at. % of the material 400. The tantalum 410 may be in an amount equal to 3.2 at. % of the material 400. In other examples, the tantalum 410 may be in an amount equal to 3.4 at. % of the material 400. In some cases, the amount of tantalum in the material 400 may range between 2.6 at. % and 4.0 at. %, 2.7 at. % and 3.9 at. %, 2.8 at. % and 3.8 at. %, 2.9 at. % and 3.7 at. %, 3 at. % and 3.6 at. %, 3.1 at. % and 3.5 at. %, or about 3.2 at. %, or about 3.3 at. %, or about 3.4 at. %.

The resistivity of the material 400 may be reduced by the presence of the tantalum-carbon compound 415 while also maintaining a high thermal stability for the material 400. Tantalum based compounds (e.g., tantalum-carbon compound 415) may include higher cohesive energy values, where the cohesive energy may be an example of the energy required for the bond and the structure. In such cases, the tantalum-carbon compound 415 may include a high bond energy associated with the bond formation between the tantalum 410 and the carbon 405. A high thermal stability may be associated with an increased strength in bonding. In some examples, the tantalum-carbon compound 415 may provide optimal resistivity characteristics at different operating temperatures as compared to a carbon-based electrode, thereby mitigating the impact of the temperature evolution on cell performance. For example, the addition of the tantalum-carbon compound 415 into the material 400 may also enable the electrode to operate in the range of 0.1-10 mohm-cm at cell seasoning and a cycling temperature of 450 degree Celsius.

The resistivity of the material 400 may be dependent on an amount of tantalum 410 in the material 400. For example, the resistivity of the material 400 may increase as an amount of tantalum 410 decreases. In such cases, a material 400 including tantalum 410 in an amount equal to 94.8 at. % of the material 400 may have a resistivity lower than a material 400 including tantalum 410 in an amount less than or equal to 10 at. % of the material 400.

In some cases, surface peak fitting results may be studied for an amount of tantalum 410 and carbon 405 in the material 400. For example, surface tantalum peak fitting may illustrate both tantalum 410 and the tantalum-carbon compound 415 with an increased binding energy. The tantalum-carbon compound 415 may include tantalum carbide with a ratio of 1:1 (e.g., one tantalum to one carbon). In some cases, the tantalum-carbon compound 415 or tantalum 410 may be oxidized at the surface of the material 400 after expose to air or anneal. The surface carbon peak fitting may illustrate both carbon 405 and the tantalum-carbon compound 415.

In other examples, a transition metal may be bonded with carbon (e.g., forming a transition metal carbide) to lower the resistivity. A transition metal carbide or transition metal nitride may be a class of refractory materials suitable to have high thermal stability, low resistivity, and high melting temperature. In some examples, a resistivity of a carbide may increase as the temperature increases. For example, the resistivity of carbides such as TiC, $W_2C$, HfC, TaC, ZrC, and NbC may increase as the temperature increases to 2,000 degree Celsius. In other examples the resistivity of $Mo_2C$ may increase as the temperature increases to 800 degree Celsius. As the temperature increases from 800 to 2,000 degree Celsius, the resistivity of $Mo_2C$ may be maintained.

Transition metals in combination with carbon, nitrogen, or both may include a high thermal stability due to a high bond energy and the metal-like capabilities. In such cases, the resistivity of the materials containing transition metals in combination with carbon, nitrogen, or both may include an optimal resistivity at various operating temperatures. In some cases, an electrode material (e.g., including a transition metal) may yield results identified in Table 1.

TABLE 1

|    | Enthalpy energy (eV/at.) |      |      |      |      | $T_m$(° C.) | $T_m$(° C.) |
|----|------|------|------|------|------|------|------|
|    | C    | N    | Te   | Se   | B    | XN   | XC   |
| Ti | 4.38 | 4.93 | 2.99 | 3.95 | 2.86 | 3290 |      |
| V  | 4.42 | 4.94 |      | 3.60 |      | 2050 |      |
| Nb | 5.90 |      |      |      |      | 2300 |      |
| Mo | 4.98 |      |      |      |      | 1750 |      |
| Ta |      | 6.33 |      |      |      | 3090 |      |
| W  |      |      |      |      |      |      |      |
| Ru | 6.85 |      |      |      | 4.62 |      |      |

As shown in Table 1, the enthalpy energy column headings may represent the system's internal energy plus the product of its pressure and volume. For example, the enthalpy energy of TaN may be 6.33 eV/atom. As shown in Table 1, the melting point ($T_m$) columns headings may represent the temperature at which the material changes state from solid to liquid. For example, the melting point of TaN may be 3,090 degree Celsius.

Figure 5:
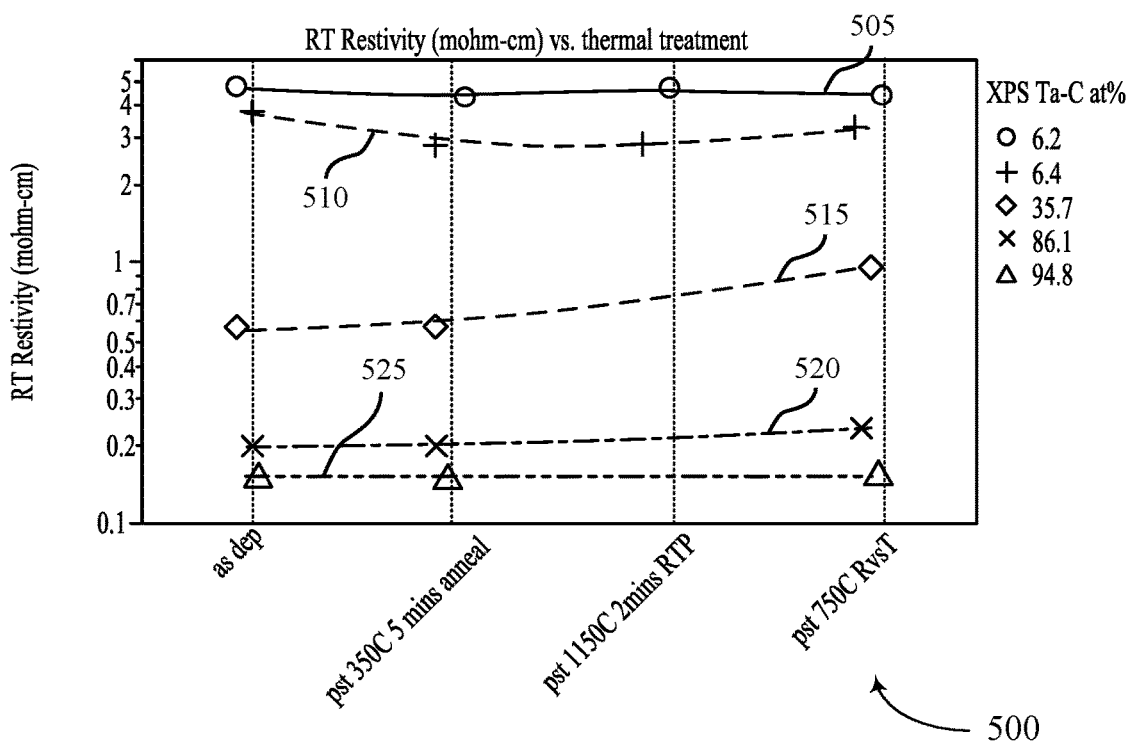
FIG. 5 illustrates an example of a plot of characteristics that supports composite electrode material chemistry in accordance with examples as disclosed herein.

FIG. 5 illustrates an example of a plot 500 of characteristics that supports composite electrode material chemistry in accordance with examples as disclosed herein. Plot 500 may include line 505 which may be representative of a material including 6.2 at. % tantalum. The line 510 may be representative of a material including 6.4 at. % tantalum. The line 515 may be representative of a material including 35.7 at. % tantalum. The line 520 may be representative of a material including 86.1 at. % tantalum. The line 525 may be representative of a material including 94.8 at. % tantalum. Plot 500 may illustrate the state of the electrode after a thermal treatment (e.g., represented on the x-axis) is applied to the electrode.

In some cases, the resistivity of the material may be reduced by the presence of a tantalum-carbon compound. In such cases, the material may maintain a high thermal stability while reducing the resistivity. In some cases, the material of the electrode may have a resistivity in a range of 0.1-10 mohm-cm across the range of operating temperatures of the memory element. The resistivity of the material of the electrode may be tuned during the manufacturing process. In such cases, the desired target resistivity may be achieved by selecting the composition of the electrode. In some examples, the material of the electrode increases a thermal stability of the electrode across the range of operating temperatures of the memory element.

The material of the electrode maintains a low resistivity as a temperature of the electrode increases. For example, as the temperature of the electrode comprising a material including 6.2 at. % tantalum increases, the resistivity of the electrode may be maintained. As the temperature of the electrode comprising a material including 6.4 at. % tantalum increases, the resistivity of the electrode may be maintained. Similarly, as the temperature of the electrode comprising a material including 35.7 at. % tantalum, 86.1 at. % tantalum, or 94.8 at. % tantalum increases, the resistivity of each electrode may be maintained. In such cases, the resistivity illustrated in plot 500 may show minimum temperature dependence in a temperature range up to 750 degree Celsius.

In some case, the resistivity may change based on the thermal treatments being applied. For example, plot 500 may illustrate a thermal treatment at 350 degree Celsius, a thermal treatment at 1150 degree Celsius, and a thermal treatment at 750 degree Celsius. The material including 35.7 at. % tantalum at a thermal treatment of 750 degree Celsius may include a higher resistivity than the material including 35.7 at. % tantalum at a thermal treatment of 350 degree Celsius. In other examples, the material including 6.4 at. % tantalum at a thermal treatment of 750 degree Celsius may include a higher resistivity than the material including 6.4 at. % tantalum at a thermal treatment of 1150 degree Celsius.

The material may be thermally stable (e.g., maintain a stable resistivity) through standard and aggressive thermal treatment, as illustrated in plot 500. For example, the resistivity for the material including 94.8 at. % tantalum may be stable across thermal treatments at 350 degree Celsius, 1150 degree Celsius, and 750 degree Celsius. In other examples, the resistivity for the material including 6.2 at. % tantalum may be stable across thermal treatments at 350 degree Celsius, 1150 degree Celsius, and 750 degree Celsius.

Figure 6:
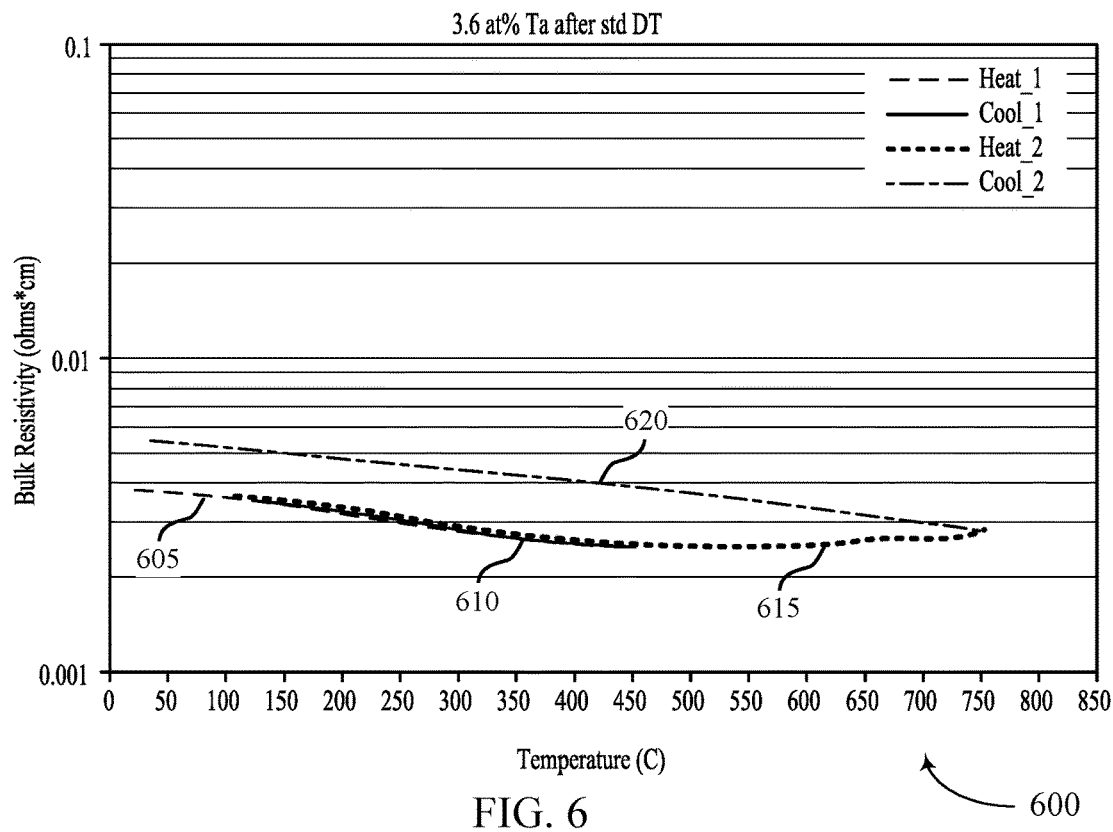
FIG. 6 illustrates an example of a plot of characteristics that supports composite electrode material chemistry in accordance with examples as disclosed herein.

FIG. 6 illustrates an example of a plot 600 of characteristics that supports composite electrode material chemistry in accordance with examples as disclosed herein. Plot 600 may include line 605 which may be representative of a material including 3.6 at. % tantalum at a first heating process. The line 610 may be representative of a material including 3.6 at. % tantalum at a first cooling process. The line 615 may be representative of a material including 3.6 at. % tantalum at a second heating process. The line 620 may be representative of a material including 3.6 at. % tantalum at a second cooling process.

In some cases, the resistivity of the material doped with the tantalum-carbon compound may result in minimum temperature dependence. For example, for the material doped with the tantalum-carbon compound and including tantalum in an amount equal to 3.6 at. % of the material, the resistivity may remain stable (e.g., refrain from increasing or decreasing) as the temperature of the material increases. In such cases, the resistivity of the material doped with the tantalum-carbon compound and including the tantalum in an amount equal to 3.6 at. % of the material may remain in a lower resistivity (e.g., below 0.01 ohms-cm) for a range of operating temperatures as compared with a resistivity of a material without the tantalum-carbon compound.

Figure 7:
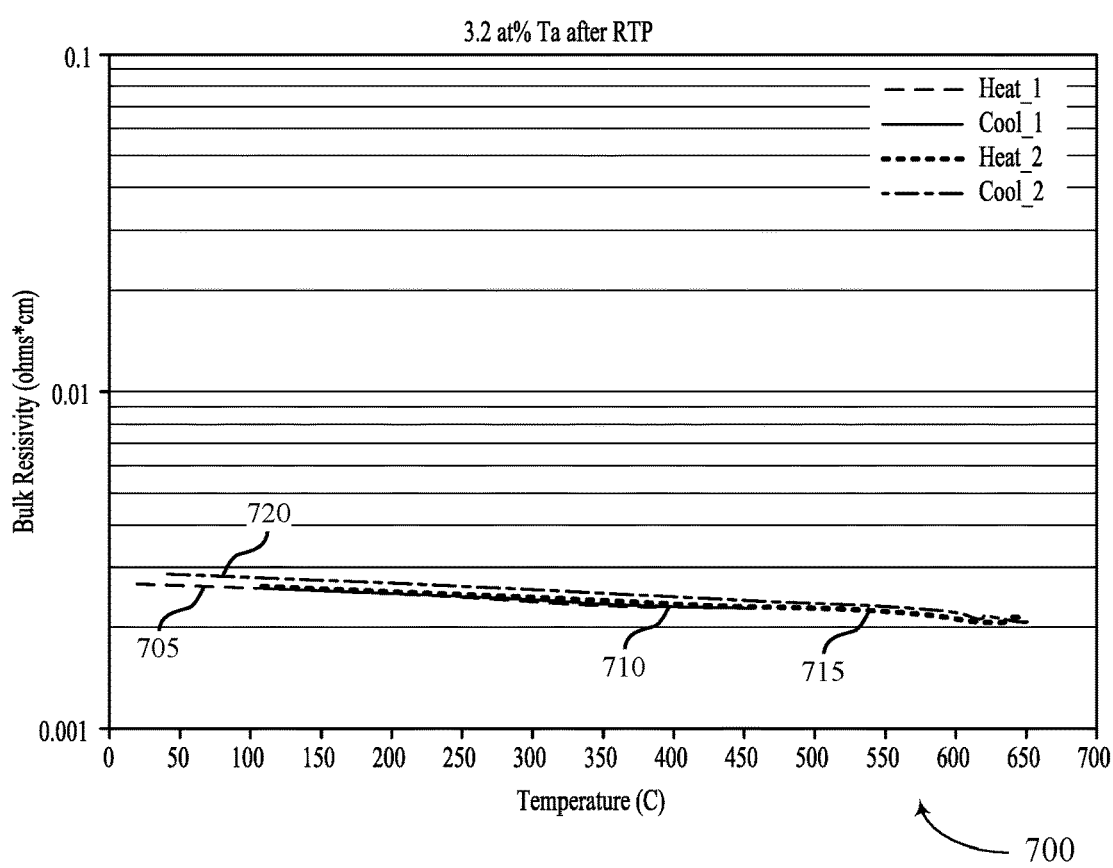
FIG. 7 illustrates an example of a plot of characteristics that supports composite electrode material chemistry in accordance with examples as disclosed herein.

FIG. 7 illustrates an example of a plot 700 of characteristics that supports composite electrode material chemistry in accordance with examples as disclosed herein. Plot 700 may include line 705 which may be representative of a material including 3.2 at. % tantalum at a first heating process. The line 710 may be representative of a material including 3.2 at. % tantalum at a first cooling process. The line 715 may be representative of a material including 3.2 at. % tantalum at a second heating process. The line 720 may be representative of a material including 3.2 at. % tantalum at a second cooling process.

In other examples, for a material doped with the tantalum-carbon compound and including the tantalum in an amount equal to 3.2 at. % of the material, the resistivity may remain stable (e.g., refrain from increasing or decreasing) as the temperature of the material increases. In such cases, the resistivity of the material doped with the tantalum-carbon compound and including the tantalum in an amount equal to 3.2 at. % of the material may remain in a lower resistivity (e.g., below 0.01 ohms-cm) for a range of operating temperatures as compared with a resistivity of a material without the tantalum-carbon compound. In some cases, the resistivity of the material may be independent of temperature.

Figure 8:
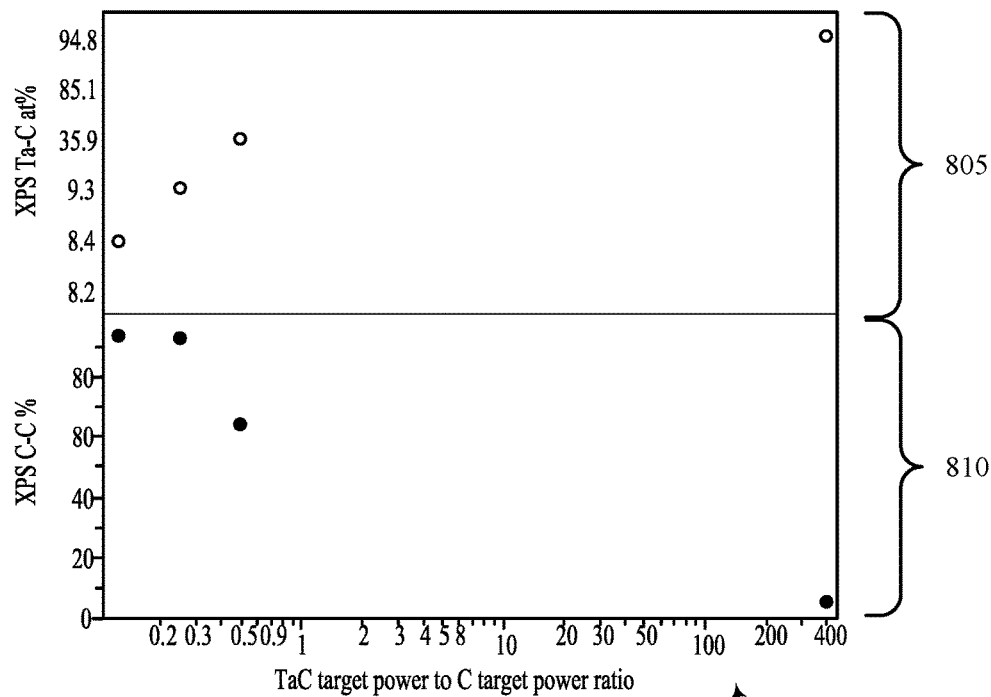
FIG. 8 illustrates an example of a plot of characteristics that supports composite electrode material chemistry in accordance with examples as disclosed herein.

FIG. 8 illustrates an example of a plot 800 of characteristics that supports composite electrode material chemistry in accordance with examples as disclosed herein. Plot 800 may include region 805 and region 810. Region 805 may represent tantalum-carbon target power to carbon target power ratio for a range of compositions (e.g., based on atomic percent of tantalum). The compositions in region 805 may include a composition including 8.4 at. % tantalum, a composition including 7.3 at. % tantalum, a composition including 35.7 at. % tantalum, and a composition including 94.8 at. % tantalum. Region 810 may represent tantalum-carbon target power to carbon target power ratio for a range of compositions (e.g., based on atomic percent of carbon). The compositions in region 810 may include a composition including approximately 93 at. % carbon, a composition including approximately 91 at. % carbon, a composition including approximately 83 at. % carbon, and a composition including approximately 2 at. % carbon.

A substrate may be sputtered with a composition a tantalum-carbon compound with a first sputtering target. In such cases, an electrode comprising a first material doped with a second material that includes the composition of the tantalum-carbon compound may be formed. The second material (e.g., including the tantalum-carbon compound) may be chemically inert with the chalcogenide material of the memory element, include a thermally stable electrical resistivity, and include a lower resistance to signals communicated between an access line and the memory element across a range of operating temperatures of the memory element as compared with a resistance of the first material (e.g., without the tantalum-carbon compound).

In some case, a substrate may be co-sputtered with carbon and tantalum-carbon compounds. The co-sputtering may occur during a physical vapor deposition (PVD) process to provide the composition and bond control. For example, the co-sputtering technique may include applying a PVD process to the substrate provided to control a bond formation between the carbon and the tantalum-carbon compound. The co-sputtering of tantalum-carbon compounds and carbon may be deposited at low temperatures (e.g., less than 100 degrees Celsius) without bias by PVD sputtering to minimize the impact on cell material in layers below the electrode.

For example, the substrate may be sputtered (e.g., co-sputtered) with carbon with a second sputtering target different than the first sputtering target. In some cases, the first sputtering target may sputter the composition the tantalum-carbon compound after the second sputtering target may sputter the carbon. In other examples, the first sputtering target may sputter the composition of the tantalum-carbon compound before the second sputtering target may sputter the carbon. Alternating the sputtering with the first sputtering target and the second sputtering target may form a multi-layer electrode composition that may depend on the sputtering time. For example, co-sputtering may allow the user to vary the composition of the material using the set of targets without breaking the vacuum. In some cases, co-sputtering may be performed by simultaneously sputtering with the first sputtering target and the second sputtering target.

As illustrated in plot 800, a tantalum-carbon to carbon target power ratio may be adjusted to obtain different bonding percentages (e.g., different compositions), thereby controlling the bonds formed. Controlling the bond percentage by optimizing the power density at which to deposit the compositions with each target separately may result in a composition comprising the tantalum-carbon compounds, where the amount of carbon may be greater than the amount of tantalum. In such cases, the atomic percent of tantalum (e.g., ratio of tantalum to carbon) can be controlled.

In some cases, the sputtering the composition of the tantalum-carbon compound may include a first power density at which to deposit the composition with the first sputtering target and sputtering the carbon may include a second power density different than the first power density at which to deposit the carbon with the second sputtering target. A target may be an example of the source when applying the tantalum-carbon compound and carbon to the substrate. The stoichiometry (e.g., bond percentage) may be controlled by optimizing the power density at which to deposit the tantalum-carbon compound and the carbon with each target separately. The power density may be an example of the power used to apply the tantalum-carbon compound and the carbon to the substrate.

The two or multiple targets may have different power ratios. The power ratio may be an example of the power at an amplifier's output to the power at the amplifier's input. In such cases, the tantalum-carbon target power to carbon target power ratio may be the power output at the tantalum-carbon compound sputtering target (e.g., first sputtering target) to the power output at the carbon sputtering target (e.g., second sputtering target). In region 805, the tantalum-carbon target power to carbon target power ratio may increase as the atomic percent of tantalum in the electrode material increases. In region 810, the tantalum-carbon target power to carbon target power ratio may increase as the atomic percent of carbon in the electrode material increases.

Figure 9:
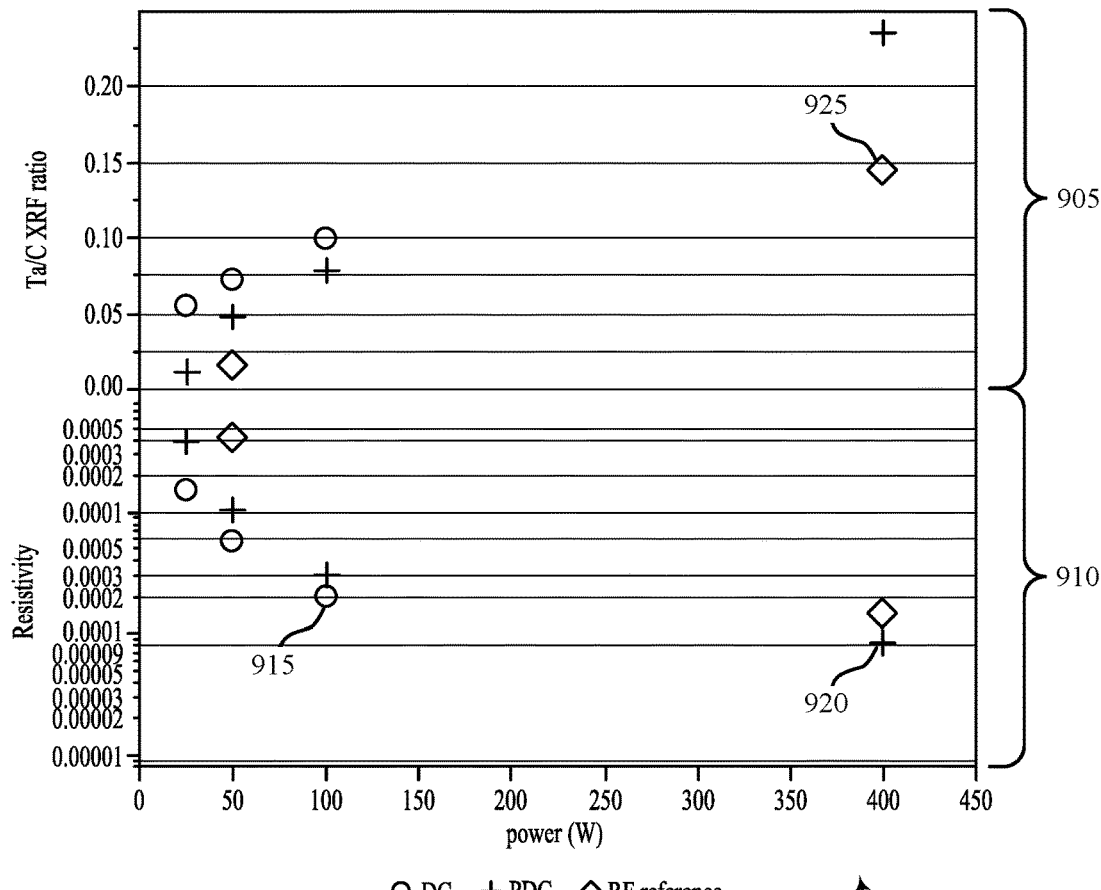
FIG. 9 illustrates an example of a plot of characteristics that supports composite electrode material chemistry in accordance with examples as disclosed herein.

FIG. 9 illustrates an example of a plot 900 of characteristics that supports composite electrode material chemistry in accordance with examples as disclosed herein. Plot 900 may include region 905 and region 910. Region 905 may represent the tantalum to carbon ratio versus the power. Region 910 may represent the resistivity versus the power. Plot 900 may also include representations of using a direct current (DC) power source 915, a pulsed direct current (PDC) power source 920, and a radio frequency (RF) power source to sputter the material of the electrode.

A substrate may be sputtered of a tantalum-carbon compound with a single target. The target may be provided with power from different power sources such as a DC power source or a PDC power source to control the composition of the material doped with the tantalum-carbon compound, thereby controlling the resistivity. For example, sputtering the tantalum-carbon compound with different power sources may result in a different tantalum to carbon ratio. For example, in region 905, as the DC power source 915 increases, the ratio of tantalum to carbon increases. In some cases, as the PDC power source 920 increases, the ratio of tantalum to carbon increases. As the RF power source 925 increases, the ratio of tantalum to carbon increases.

The target may be provided with power from different power sources such as a DC power source or a PDC power source to control the resistivity of the material of the electrode. In such cases, an increase in power provided to the power source may decrease the resistivity of the material doped with the tantalum-carbon compound. For example, in region 910, as the power provided to the DC power source 915 decreases, the resistivity of the of the material doped with the tantalum-carbon compound decreases. In some cases, as the power provided to the PDC power source 920 decreases, the resistivity of the material doped with the tantalum-carbon compound decreases. As the power provided to the RF power source 925 decreases, the resistivity of the material doped with the tantalum-carbon compound decreases.

A material may be sputtered with a sputtering target to form an electrode including a second material that includes the tantalum-carbon compound. In such cases, the second material may be chemically inert with the chalcogenide material of the memory element, include a thermally stable electrical resistivity, and include a lower resistance to signals communicated between an access line and the memory element across a range of operating temperatures of the memory element as compared with a material without the tantalum-carbon compound. For example, the sputtering technique may include depositing, on a substrate, carbon, and depositing, on the substrate, tantalum at a same time as depositing the carbon.

In some cases, the sputtering target is powered by a DC power source. The DC power source may be used with electrically conductive target materials (e.g., substrates). Using a DC power source may be cost effective and easier to control the deposition as opposed to other power sources (e.g., PDC power source, RF power source, etc.). For example, using a DC power source may control the bond formation by depositing the carbon and the tantalum at a same time with a current power source.

In some cases, the sputtering target is powered by a PDC power source. The PDC power source may be configured to adjust a frequency at which to deposit the carbon and the tantalum. For example, the PDC power source may include a variable frequency. The voltage regulation is achieved by varying the ratio of on-to-off time (e.g., duty cycles). In some cases, a bi-polar PDC power source may use two pulses to deposit the carbon and the tantalum. In some cases, the PDC power source may sputter via a PVD technique to control the bond formation. Sputtering with a PDC power source may be effective for the sputtering of metals (e.g., tantalum) and dielectric coating which are insulating non-conducting materials that may acquire a charge. In some cases, sputtering techniques may be detectable under cross-section TEM/EELS/EDX.

Figures 10A, 10B, 10C:
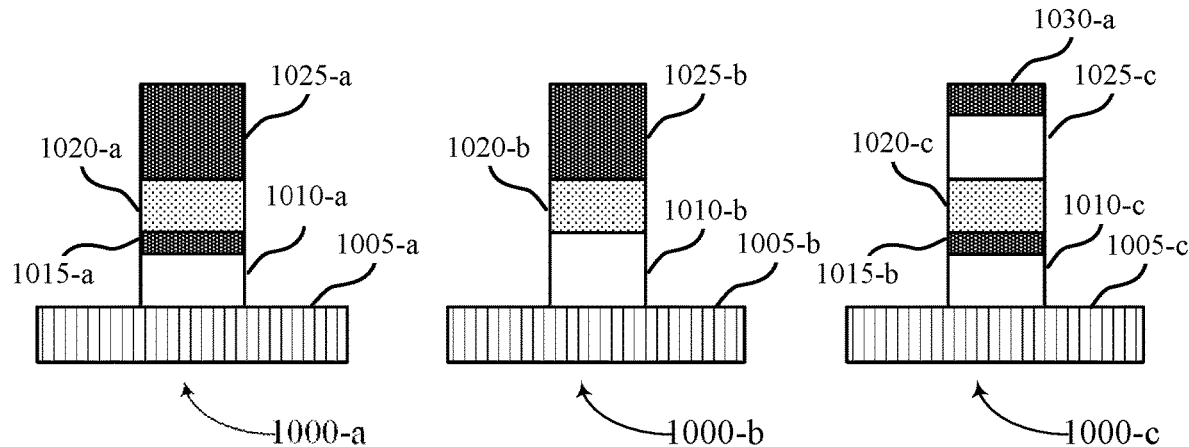

FIG. 10A illustrates an example of a memory device 1000-a that supports composite electrode material chemistry in accordance with examples as disclosed herein. Memory device 1000-a may be an example of memory device with reference to FIG. 1. Memory device 1000-a includes access line 1005-a which may be an example of an access line, as described with reference to FIGS. 2 and 3. Memory device 1000-a may also include electrode 1010-a, electrode 1025-a, and memory element 1020-a, which may be an example of electrode 325 and storage element 320, respectively, as described with reference to FIG. 3. Memory device 1000-a also includes interface layer 1015-a.

Memory device 1000-a may be made by various combinations of material formation and removal. For example, layers of material may be deposited that correspond to the access line 1005-a, electrode 1010-a, interface layer 1015-a, memory element 1020-a, and electrode 1025-a. Material may be selectively removed to then create the desired features, such as the pillar structure depicted in FIG. 10A.

Access line 1005-a may be made of tungsten, tungsten silicon nitride, or both. The electrode 1010-a may be coupled with the interface layer 1015-a and the access line 1005-a. In some cases, electrode 1010-a may include the material including the tantalum-carbon compound where the material may be operable to be chemically inert with the memory element 1020-*a*. The material may include a thermally stable electrical resistivity and a lower resistance to signals communicated between the access line 1005-*a* and the memory element 1020-*a* across a range of operating temperatures of the memory element 1020-*a* as compared with a resistance of a material without the tantalum-carbon compound. For example, the composition of the electrode material may prevent a chemical reaction from occurring between the electrode 1010-*a* and the memory element 1020-*a*.

The interface layer 1015-*a* may be coupled between the electrode 1010-*a* and the memory element 1020-*a*. In such cases, the interface layer 1015-*a* may be operable to provide a lower resistance to signals communicated between the access line 1005-*a* and the memory element 1020-*a* across the range of operating temperatures of the memory element 1020-*a* as compared with a resistance of a material without the tantalum-carbon compound. In some examples, the interface layer 1015-*a* may include carbon (e.g., without tantalum).

A memory element 1020-*a* may be located between interface layer 1015-*a* and electrode 1025-*a*. Memory element 1020-*a* may be an example of a self-selecting memory component. For example, memory element 1020-*a* may be an example of a storage element that has a variable resistance. In such cases, memory element 1020-*a* may include metal oxides, chalcogenides, and the like. The chalcogenide materials may be materials or alloys that include at least one of the elements sulfur (S), tellurium (Te), or Se. Many chalcogenide alloys may be possible—for example, a germanium-antimony (Sb)-tellurium alloy (Ge—Sb—Te) is a chalcogenide material. Other chalcogenide alloys not expressly recited here may also be employed.

The electrode 1025-*a* may be coupled with the memory element 1020-*a* and an access line. In some examples, the electrode 1025-*a* may be formed of carbon (e.g., without tantalum). In some cases, the carbon may be operable to be chemically inert with the memory element 1020-*a* and provide a lower resistance to signals communicated between the access line and the memory element 1020-*a* across the range of operating temperatures of the memory element 1020-*a* as compared with a resistance of a material without the tantalum-carbon compound. For example, the carbon may prevent a chemical reaction from occurring between the electrode 1025-*a* and the memory element 1020-*a*.

In some cases, memory device 1000-*a* including electrode 1010-*a* with the material including the tantalum-carbon compound and electrode 1025-*a* with the carbon may tune the resistivity of the overall memory device 1000-*a*. In some cases, it may be beneficial for the electrode 1010-*a* to include the material including the tantalum-carbon compound as opposed to the electrode 1025-*a* because the seasoning may include a higher impact on the bottom electrode (e.g., electrode 1010-*a*). In such cases, the electrode 1010-*a* may include a lower resistivity than electrode 1025-*a* to address the seasoning. In some cases, it may be preferable to have the carbon adjacent to the memory element 1020-*a* (e.g., the composition of interface layer 1015-*a* and electrode 1025-*a*).

FIG. 10B illustrates an example of a memory device 1000-*b* that supports composite electrode material chemistry in accordance with examples as disclosed herein. Memory device 1000-*b* may be an example of memory device with reference to FIGS. 1 and 10A. Memory device 1000-*b* includes access line 1005-*b* which may be an example of an access line, as described with reference to FIGS. 2, 3, and 10A. Memory device 1000-*b* may also include electrode 1010-*b*, electrode 1025-*b*, and memory element 1020-*b*, which may be an example of electrode 325 and storage element 320, respectively, as described with reference to FIG. 3.

Access line 1005-*b* may be made of tungsten, tungsten silicon nitride, or both. The electrode 1010-*b* may be coupled with the access line 1005-*b* and the memory element 1020-*b*. In some cases, electrode 1010-*b* may include a material including a tantalum-carbon compound where the material may be operable to be chemically inert with the memory element 1020-*b*. The material may include a thermally stable electrical resistivity and a lower resistance to signals communicated between the access line 1005-*b* and the memory element 1020-*b* across a range of operating temperatures of the memory element 1020-*b* as compared with a resistance of a material without the tantalum-carbon compound. For example, the electrode material may prevent a chemical reaction from occurring between the electrode 1010-*b* and the memory element 1020-*b*.

A memory element 1020-*b* may be located between electrode 1010-*b* and electrode 1025-*b*. Memory element 1020-*b* may be an example of memory element 1020-*a* as described with reference to FIG. 10A. The electrode 1025-*b* may be coupled with the memory element 1020-*b* and an access line. In some examples, the electrode 1025-*b* may include carbon (e.g., without tantalum). In some cases, the carbon may be operable to be chemically inert with the memory element 1020-*b* and provide a lower resistance to signals communicated between the access line and the memory element 1020-*b* across the range of operating temperatures of the memory element 1020-*b* as compared with a resistance of a material without the tantalum-carbon compound. For example, the carbon may prevent a chemical reaction from occurring between the electrode 1025-*b* and the memory element 1020-*b*.

In some cases, memory device 1000-*b* including electrode 1010-*b* with the material including the tantalum-carbon compound and electrode 1025-*b* with the carbon may tune the resistivity of the overall memory device 1000-*b*. In some cases, it may be beneficial for the electrode 1010-*b* to include the material including the tantalum-carbon compound as opposed to the electrode 1025-*b* because the seasoning may include a higher impact on the bottom electrode (e.g., electrode 1010-*b*). In such cases, the electrode 1010-*b* may include a lower resistivity than electrode 1025-*b* to address the seasoning.

FIG. 10C illustrates an example of a memory device 1000-*c* that supports composite electrode material chemistry in accordance with examples as disclosed herein. Memory device 1000-*c* may be an example of memory device with reference to FIGS. 1 and 10A. Memory device 1000-*c* includes access line 1005-*c* which may be an example of an access line, as described with reference to FIGS. 2, 3, and 10A. Memory device 1000-*c* may also include electrode 1010-*c*, electrode 1025-*c*, and memory element 1020-*c*, which may be an example of electrode 325 and storage element 320, respectively, as described with reference to FIG. 3. Memory device 1000-*c* also includes interface layer 1015-*b*.

Access line 1005-*c* may be made of tungsten, tungsten silicon nitride, or both. The electrode 1010-*c* may be coupled with the interface layer 1015-*b* and the access line 1005-*c*. In some cases, electrode 1010-*c* may include a material including a tantalum-carbon compound where the material may be operable to be chemically inert with the memory element 1020-*c*. The material may include a thermally stable electrical resistivity and a lower resistance to signals communicated between the access line 1005-c and the memory element 1020-c across a range of operating temperatures of the memory element 1020-c as compared with a resistance of a material without the tantalum-carbon compound. For example, the composition of the electrode material may prevent a chemical reaction from occurring between the electrode 1010-c and the memory element 1020-c.

The interface layer 1015-b may be coupled between the electrode 1010-c and the memory element 1020-c. In such cases, the interface layer 1015-b may be operable to provide a lower resistance to signals communicated between the access line 1005-c and the memory element 1020-c across the range of operating temperatures of the memory element 1020-c as compared with a resistance of a material without the tantalum-carbon compound. In some examples, the interface layer 1015-b may include carbon (e.g., without tantalum). In some cases, it may be preferable to have the carbon adjacent to the memory element 1020-c (e.g., the composition of interface layer 1015-b).

A memory element 1020-c may be located between interface layer 1015-b and electrode 1025-c. Memory element 1020-c may be an example of memory element 1020-a as described with reference to FIG. 10A. The electrode 1025-c may be coupled with the memory element 1020-c and an interface layer 1030-a. In some examples, the electrode 1025-c may include a material including a tantalum-carbon compound where the material may be operable to be chemically inert with the memory element 1020-c. The material may include a thermally stable electrical resistivity and a lower resistance to signals communicated between the access line and the memory element 1020-c across a range of operating temperatures of the memory element 1020-c as compared with a resistance of a material without the tantalum-carbon compound. For example, the composition of the electrode material may prevent a chemical reaction from occurring between the electrode 1025-c and the memory element 1020-c.

In some examples, memory device 1000-c may include interface layer 1030-a. Interface layer 1030-a may be coupled between the electrode 1025-c and an access line. In such cases, the interface layer 1030-a may be operable to provide a lower resistance to signals communicated between the access line and the memory element 1020-c across the range of operating temperatures of the memory element 1020-c as compared with a resistance of a material without the tantalum-carbon compound. In some examples, the interface layer 1030-a may include carbon (e.g., without tantalum).

Figures 10D, 10E:
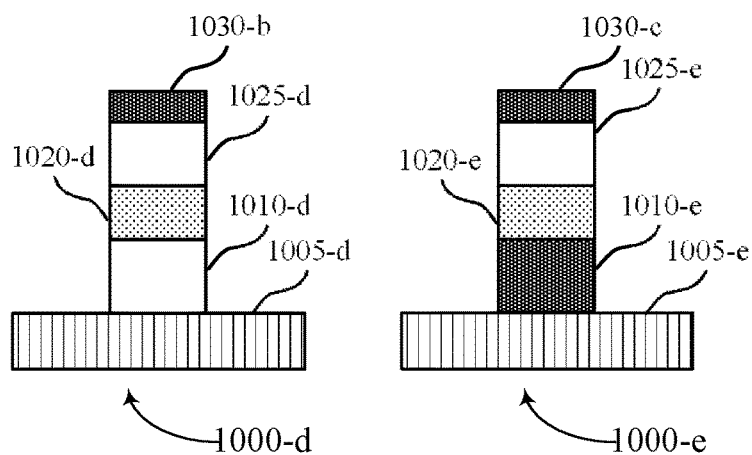

FIG. 10D illustrates an example of a memory device 1000-d that supports composite electrode material chemistry in accordance with examples as disclosed herein. Memory device 1000-d may be an example of memory device with reference to FIGS. 1 and 10A. Memory device 1000-d includes access line 1005-d which may be an example of an access line, as described with reference to FIGS. 2, 3, and 10A. Memory device 1000-d may also include electrode 1010-d, electrode 1025-d, and memory element 1020-d, which may be an example of electrode 325 and storage element 320, respectively, as described with reference to FIG. 3. Memory device 1000-d also includes interface layer 1030-b.

Access line 1005-d may be made of tungsten, tungsten silicon nitride, or both. The electrode 1010-d may be coupled with the access line 1005-d and the memory element 1020-d. In some cases, electrode 1010-d may include a material including a tantalum-carbon compound where the material may be operable to be chemically inert with the memory element 1020-d. The material may include a thermally stable electrical resistivity and a lower resistance to signals communicated between the access line 1005-d and the memory element 1020-d across a range of operating temperatures of the memory element 1020-d as compared with a resistance of a material without the tantalum-carbon compound. For example, the composition of the electrode material may prevent a chemical reaction from occurring between the electrode 1010-d and the memory element 1020-d.

A memory element 1020-d may be located between electrode 1010-d and electrode 1025-d. Memory element 1020-d may be an example of memory element 1020-a as described with reference to FIG. 10A. The electrode 1025-d may be coupled with the memory element 1020-d and an interface layer 1030-b. In some examples, the electrode 1025-d may include a material including a tantalum-carbon compound where the material may be operable to be chemically inert with the memory element 1020-d. The material may include a thermally stable electrical resistivity and a lower resistance to signals communicated between the access line and the memory element 1020-d across a range of operating temperatures of the memory element 1020-d as compared with a resistance of a material without the tantalum-carbon compound. For example, the composition of the electrode material may prevent a chemical reaction from occurring between the electrode 1025-d and the memory element 1020-d.

In some examples, memory device 1000-d may include interface layer 1030-b. Interface layer 1030-b may be coupled between the electrode 1025-d and an access line. In such cases, the interface layer 1030-b may be operable to provide a lower resistance to signals communicated between the access line and the memory element 1020-d across the range of operating temperatures of the memory element 1020-d as compared with a resistance of a material without the tantalum-carbon compound. In some examples, the interface layer 1030-b may include carbon (e.g., without tantalum).

FIG. 10E illustrates an example of a memory device 1000-e that supports composite electrode material chemistry in accordance with examples as disclosed herein. Memory device 1000-e may be an example of memory device with reference to FIGS. 1 and 10A. Memory device 1000-e includes access line 1005-e which may be an example of an access line, as described with reference to FIGS. 2, 3, and 10A. Memory device 1000-e may also include electrode 1010-e, electrode 1025-e, and memory element 1020-e, which may be an example of electrode 325 and storage element 320, respectively, as described with reference to FIG. 3. Memory device 1000-e also includes interface layer 1030-c.

Access line 1005-e may be made of tungsten, tungsten silicon nitride, or both. The electrode 1010-e may be coupled with the access line 1005-e and the memory element 1020-e. In some cases, electrode 1010-e may include carbon (e.g., without tantalum). The carbon may be operable to be chemically inert with the memory element 1020-e and to provide a lower resistance to signals communicated between the access line 1005-e and the memory element 1020-e across a range of operating temperatures of the memory element 1020-e as compared with a resistance of a material without the tantalum-carbon compound. For example, the carbon may prevent a chemical reaction from occurring between the electrode 1010-e and the memory element 1020-e.

A memory element 1020-e may be located between electrode 1010-e and electrode 1025-e. Memory element 1020-e may be an example of memory element 1020-a as described with reference to FIG. 10A. The electrode 1025-e may be coupled with the memory element 1020-e and an interface layer 1030-c. In some examples, the electrode 1025-e may include a material including a tantalum-carbon compound where the material may be operable to be chemically inert with the memory element 1020-e. The material may include a thermally stable electrical resistivity and a lower resistance to signals communicated between the access line and the memory element 1020-e across a range of operating temperatures of the memory element 1020-e e as compared with a resistance of a material without the tantalum-carbon compound. For example, the composition of the electrode material may prevent a chemical reaction from occurring between the electrode 1025-e and the memory element 1020-e. In some cases, memory device 1000-e including electrode 1025-e with the material including the tantalum-carbon compound and electrode 1010-e with the carbon may tune the resistivity of the overall memory device 1000-e.

In some examples, memory device 1000-e may include interface layer 1030-c. Interface layer 1030-c may be coupled between the electrode 1025-e and an access line. In such cases, the interface layer 1030-c may be operable to provide a lower resistance to signals communicated between the access line and the memory element 1020-e across the range of operating temperatures of the memory element 1020-e as compared with a resistance of a material without the tantalum-carbon compound. In some examples, the interface layer 1030-c may include carbon (e.g., without tantalum).

FIG. 10F illustrates an example of a memory device 1000-f that supports composite electrode material chemistry in accordance with examples as disclosed herein. Memory device 1000-f may be an example of memory device with reference to FIGS. 1 and 10A. Memory device 1000-f includes access line 1005-f which may be an example of an access line, as described with reference to FIGS. 2, 3, and 10A. Memory device 1000-f may also include electrode 1010-f, electrode 1025-f, and memory element 1020-f, which may be an example of electrode 325 and storage element 320, respectively, as described with reference to FIG. 3. Memory device 1000-f also includes interface layer 1030-d.

Access line 1005-f may be made of tungsten, tungsten silicon nitride, or both. The electrode 1010-f may be coupled with the access line 1005-f and the memory element 1020-f. In some cases, electrode 1010-f may include carbon (e.g., without tantalum). The carbon may be operable to be chemically inert with the memory element 1020-f and to provide a lower resistance to signals communicated between the access line 1005-f and the memory element 1020-f across a range of operating temperatures of the memory element 1020-f as compared with a resistance of a material without the tantalum-carbon compound. For example, the carbon may prevent a chemical reaction from occurring between the electrode 1010-f and the memory element 1020-f.

A memory element 1020-f may be located between electrode 1010-f and electrode 1025-f Memory element 1020-f may be an example of memory element 1020-a as described with reference to FIG. 10A. The electrode 1025-f may be coupled with the memory element 1020-f and an interface layer 1030-d. In some examples, the electrode 1025-f may include a material including a tantalum-carbon compound where the material may be operable to be chemically inert with the memory element 1020-f. The material may include a thermally stable electrical resistivity and a lower resistance to signals communicated between the access line and the memory element 1020-f across a range of operating temperatures of the memory element 1020-f as compared with a resistance of a material without the tantalum-carbon compound. For example, the composition of the electrode material may prevent a chemical reaction from occurring between the electrode 1025-f and the memory element 1020-f.

In some cases, the material of electrode 1025-f may also include carbon. For example, electrode 1025-f may include a gradient of carbon where the carbon is concentrated at an interface of the interface layer 1030-d and dispersed at the interface layer of the memory element 1020-f. For example, the material of electrode 1025-f may include pure carbon at the interface between the interface layer 1030 and a mixture of pure carbon and the tantalum-carbon compound at the interface between the memory element 1020-f. The composite electrode 1025-f composition of the tantalum-carbon compound and the carbon may reduce the resistivity as compared to the electrode 1025-f comprised of only the tantalum-carbon compound or carbon. In such cases, the material of electrode 1025-f may improve the seasoning efficiency and reliability of the memory device 1000-f by producing consistent thermal properties and spike current annealing effects.

In some examples, memory device 1000-f may include interface layer 1030-d. Interface layer 1030-d may be coupled between the electrode 1025-f and an access line. In such cases, the interface layer 1030-d may be operable to provide a lower resistance to signals communicated between the access line and the memory element 1020-f across the range of operating temperatures of the memory element 1020-f as compared with a resistance of a material without the tantalum-carbon compound. In some examples, the interface layer 1030-d may include carbon (e.g., without tantalum).

FIG. 10G illustrates an example of a memory device 1000-g that supports composite electrode material chemistry in accordance with examples as disclosed herein. Memory device 1000-g may be an example of memory device with reference to FIGS. 1 and 10A. Memory device 1000-g includes access line 1005-g which may be an example of an access line, as described with reference to FIGS. 2, 3, and 10A. Memory device 1000-b may also include electrode 1010-g, electrode 1025-g, and memory element 1020-g, which may be an example of electrode 325 and storage element 320, respectively, as described with reference to FIG. 3.

Access line 1005-g may be made of tungsten, tungsten silicon nitride, or both. The electrode 1010-g may be coupled with the access line 1005-g and the memory element 1020-g. In some examples, the electrode 1010-g may include carbon (e.g., without tantalum). In some cases, the carbon may be operable to be chemically inert with the memory element 1020-g and provide a lower resistance to signals communicated between the access line 1005-g and the memory element 1020-g across the range of operating temperatures of the memory element 1020-g as compared with a resistance of a material without the tantalum-carbon compound. For example, the carbon may prevent a chemical reaction from occurring between the electrode 1010-g and the memory element 1020-g.

A memory element 1020-g may be located between electrode 1010-g and electrode 1025-g. Memory element 1020-g may be an example of memory element 1020-a as described with reference to FIG. 10A. The electrode 1025-*g* may be coupled with the memory element 1020-*b* and an access line. In some cases, electrode 1025-*g* may include a material including a tantalum-carbon compound where the material may be operable to be chemically inert with the memory element 1020-*g*. The material may include a thermally stable electrical resistivity and a lower resistance to signals communicated between the access line and the memory element 1020-*g* across a range of operating temperatures of the memory element 1020-*g* as compared with a resistance of a material without the tantalum-carbon compound. For example, the composition of the electrode material may prevent a chemical reaction from occurring between the electrode 1025-*g* and the memory element 1020-*g*. In some cases, memory device 1000-*g* including electrode 1010-*g* with the carbon and electrode 1025-*g* with the material including the tantalum-carbon compound may tune the resistivity of the overall memory device 1000-*g*.

FIG. 10H illustrates an example of a memory device 1000-*h* that supports composite electrode material chemistry in accordance with examples as disclosed herein. Memory device 1000-*h* may be an example of memory device with reference to FIGS. 1 and 10A. Memory device 1000-*h* includes access line 1005-*h* which may be an example of an access line, as described with reference to FIGS. 2, 3, and 10A. Memory device 1000-*h* may also include electrode 1010-*h*, electrode 1025-*h*, and memory element 1020-*h*, which may be an example of electrode 325 and storage element 320, respectively, as described with reference to FIG. 3.

Access line 1005-*h* may be made of tungsten, tungsten silicon nitride, or both. The electrode 1010-*h* may be coupled with the access line 1005-*h* and the memory element 1020-*h*. In some cases, electrode 1010-*h* may include a material including a tantalum-carbon compound where the material may be operable to be chemically inert with the memory element 1020-*h*. The material may include a thermally stable electrical resistivity and a low resistance to signals communicated between the access line 1005-*h* and the memory element 1020-*h* across a range of operating temperatures of the memory element 1020-*h* as compared with a resistance of a material without the tantalum-carbon compound. For example, the composition of the electrode material may prevent a chemical reaction from occurring between the electrode 1010-*h* and the memory element 1020-*h*.

A memory element 1020-*h* may be located between electrode 1010-*h* and electrode 1025-*h*. Memory element 1020-*h* may be an example of memory element 1020-*a* as described with reference to FIG. 10A. The electrode 1025-*h* may be coupled with the memory element 1020-*h* and an access line. In some examples, the electrode 1025-*h* may include a material including a tantalum-carbon compound where the material may be operable to be chemically inert with the memory element 1020-*h*. The material may include a thermally stable electrical resistivity and a lower resistance to signals communicated between the access line 1005-*h* and the memory element 1020-*h* across a range of operating temperatures of the memory element 1020-*h* as compared with a resistance of a material without the tantalum-carbon compound. For example, the composition of the electrode material may prevent a chemical reaction from occurring between the electrode 1025-*h* and the memory element 1020-*h*.

In some cases, memory device 1000-*h* including electrode 1010-*h* with the material including the tantalum-carbon compound and electrode 1025-*h* with the material including the tantalum-carbon compound may tune the resistivity of the overall memory device 1000-*h*. In some cases, it may be beneficial for both the electrode 1010-*h* and the electrode 1025-*h* to include the material including the tantalum-carbon compound as opposed to either the electrode 1025-*b* or the electrode 1010-*h*.

FIG. 10I illustrates an example of a memory device 1000-*i* that supports composite electrode material chemistry in accordance with examples as disclosed herein. Memory device 1000-*i* may be an example of memory device with reference to FIGS. 1 and 10A. Memory device 1000-*i* includes access line 1005-*i* which may be an example of an access line, as described with reference to FIGS. 2, 3, and 10A. Memory device 1000-*i* may also include electrode 1010-*i*, electrode 1025-*i*, and memory element 1020-*i*, which may be an example of electrode 325 and storage element 320, respectively, as described with reference to FIG. 3. Memory device 1000-*i* also includes interface layer 1015-*c* and interface layer 1030-*i*.

Access line 1005-*i* may be made of tungsten, tungsten silicon nitride, or both. The electrode 1010-*i* may be coupled with the interface layer 1015-*c* and the access line 1005-*i*. In some cases, electrode 1010-*i* may include a material including a tantalum-carbon compound operable to be chemically inert with the memory element 1020-*i*. The material may include a thermally stable electrical resistivity and a lower resistance to signals communicated between the access line 1005-*i* and the memory element 1020-*i* across a range of operating temperatures of the memory element 1020-*i* as compared with a resistance of a material without the tantalum-carbon compound. For example, the electrode material may prevent a chemical reaction from occurring between the electrode 1010-*i* and the memory element 1020-*i*.

The interface layer 1015-*c* may be coupled between the electrode 1010-*i* and the memory element 1020-*i*. In such cases, the interface layer 1015-*c* may be operable to provide a lower resistance to signals communicated between the access line 1005-*i* and the memory element 1020-*i* across the range of operating temperatures of the memory element 1020-*i* as compared with a resistance of a material without the tantalum-carbon compound. In some examples, the interface layer 1015-*c* may include carbon (e.g., without tantalum). In some cases, it may be preferable to have the carbon adjacent to the memory element 1020-*i* (e.g., the composition of interface layer 1015-*c*).

A memory element 1020-*i* may be located between interface layer 1015-*i* and interface layer 1035-*a*. Memory element 1020-*i* may be an example of memory element 1020-*a* as described with reference to FIG. 10A. Interface layer 1035-*a* may be coupled between the electrode 1025-*i* and the memory element 1020-*i*. In such cases, the interface layer 1035-*a* may be operable to provide a lower resistance to signals communicated between the access line and the memory element 1020-*i* across the range of operating temperatures of the memory element 1020-*i* as compared with a resistance of a material without the tantalum-carbon compound. In some examples, the interface layer 1035-*a* may include carbon (e.g., without tantalum).

The electrode 1025-*i* may be coupled with the memory the interface layer 1035-*a*. In some examples, the electrode 1025-*i* may include a material including a tantalum-carbon compound where the material may be operable to be chemically inert with the memory element 1020-*i*. and to provide a low resistance to signals communicated between the access line and the memory element 1020-*i* across a range of operating temperatures of the memory element 1020-*i*. For example, the composition of the electrode material may prevent a chemical reaction from occurring between the electrode 1025-*i* and the memory element 1020-*i*.

FIG. 10J illustrates an example of a memory device 1000-*j* that supports composite electrode material chemistry in accordance with examples as disclosed herein. Memory device 1000-*j* may be an example of memory device with reference to FIGS. 1 and 10A. Memory device 1000-*j* includes access line 1005-*j* which may be an example of an access line, as described with reference to FIGS. 2, 3, and 10A. Memory device 1000-*j* may also include electrode 1010-*j*, electrode 1025-*j*, and memory element 1020-*j*, which may be an example of electrode 325 and storage element 320, respectively, as described with reference to FIG. 3. Memory device 1000-*j* also includes interface layer 1015-*d*, interface layer 1017-*a*, interface layer 1030-*e*, and interface layer 1035-*b*.

Access line 1005-*j* may be made of tungsten, tungsten silicon nitride, or both. Interface layer 1017-*a* may be coupled with the access line 1005-*j*. The electrode 1010-*j* may be coupled with the interface layer 1015-*d* and the interface layer 1017-*a*. The interface layer 1017-*a* may be operable to provide a lower resistance to signals communicated between the access line 1005-*j* and the memory element 1020-*j* across the range of operating temperatures of the memory element 1020-*j* as compared with a resistance of a material without the tantalum-carbon compound. In some examples, the interface layer 1017-*a* may include carbon (e.g., without tantalum).

In some cases, electrode 1010-*j* may include a material including a tantalum-carbon compound where the material may be operable to be chemically inert with the memory element 1020-*j*. The material may include a thermally stable electrical resistivity and a lower resistance to signals communicated between the access line 1005-*j* and the memory element 1020-*j* across a range of operating temperatures of the memory element 1020-*j* as compared with a resistance of a material without the tantalum-carbon compound. For example, the composition of the electrode material may prevent a chemical reaction from occurring between the electrode 1010-*j* and the memory element 1020-*j*.

The interface layer 1015-*d* may be coupled between the electrode 1010-*j* and the memory element 1020-*j*. In such cases, the interface layer 1015-*d* may be operable to provide a lower resistance to signals communicated between the access line 1005-*j* and the memory element 1020-*j* across the range of operating temperatures of the memory element 1020-*j* as compared with a resistance of a material without the tantalum-carbon compound. In some examples, the interface layer 1015-*d* may include carbon (e.g., without tantalum). In some cases, it may be preferable to have the carbon adjacent to the memory element 1020-*j* (e.g., the composition of interface layer 1015-*d*).

A memory element 1020-*j* may be located between interface layer 1015-*d* and interface layer 1035-*b*. Memory element 1020-*j* may be an example of memory element 1020-*a* as described with reference to FIG. 10A. Interface layer 1035-*b* may be coupled between the electrode 1025-*j* and the memory element 1020-*j*. In such cases, the interface layer 1035-*b* may be operable to provide a lower resistance to signals communicated between the access line and the memory element 1020-*j* across the range of operating temperatures of the memory element 1020-*j* as compared with a resistance of a material without the tantalum-carbon compound j. In some examples, the interface layer 1035-*b* may include carbon (e.g., without tantalum).

The electrode 1025-*j* may be coupled with the interface layer 1035-*b* and an interface layer 1030-*e*. In some examples, the electrode 1025-*j* may a material including a tantalum-carbon compound where the material may be operable to be chemically inert with the memory element 1020-*j*. The material may include a thermally stable electrical resistivity and a lower resistance to signals communicated between the access line and the memory element 1020-*j* across a range of operating temperatures of the memory element 1020-*j* as compared with a resistance of a material without the tantalum-carbon compound. For example, the composition of the electrode material may prevent a chemical reaction from occurring between the electrode 1025-*j* and the memory element 1020-*j*.

In some examples, memory device 1000-*j* may include interface layer 1030-*e*. Interface layer 1030-*e* may be coupled between the electrode 1025-*j* and an access line. In such cases, the interface layer 1030-*e* may be operable to provide a lower resistance to signals communicated between the access line and the memory element 1020-*j* across the range of operating temperatures of the memory element 1020-*jv* as compared with a resistance of a material without the tantalum-carbon compound. In some examples, the interface layer 1030-*e* may include carbon (e.g., without tantalum).

FIGS. 10A-10J illustrate a variety of electrode configurations for a memory cell, including different configurations of top electrodes and bottom electrodes. Some electrode configurations include one or more interfaces as well. Some electrode interfaces may include compositions that have a gradient of materials from a first end to a second end, such that a composition of carbon and tantalum at the first end is different than a composition of carbon and tantalum at the second end. Any of the electrode configurations (whether for a top electrode or a bottom electrode) may be combined to form a pillar of a memory cell. The disclosure is not limited to the express pillar configurations illustrated. Additionally or alternatively, any of the electrode configurations may be rotated or changed. In some cases, using a configuration illustrated as a bottom electrode for a top electrode may result in a rotation or flipping of the structure relative to the illustrated configuration.

Figure 11:
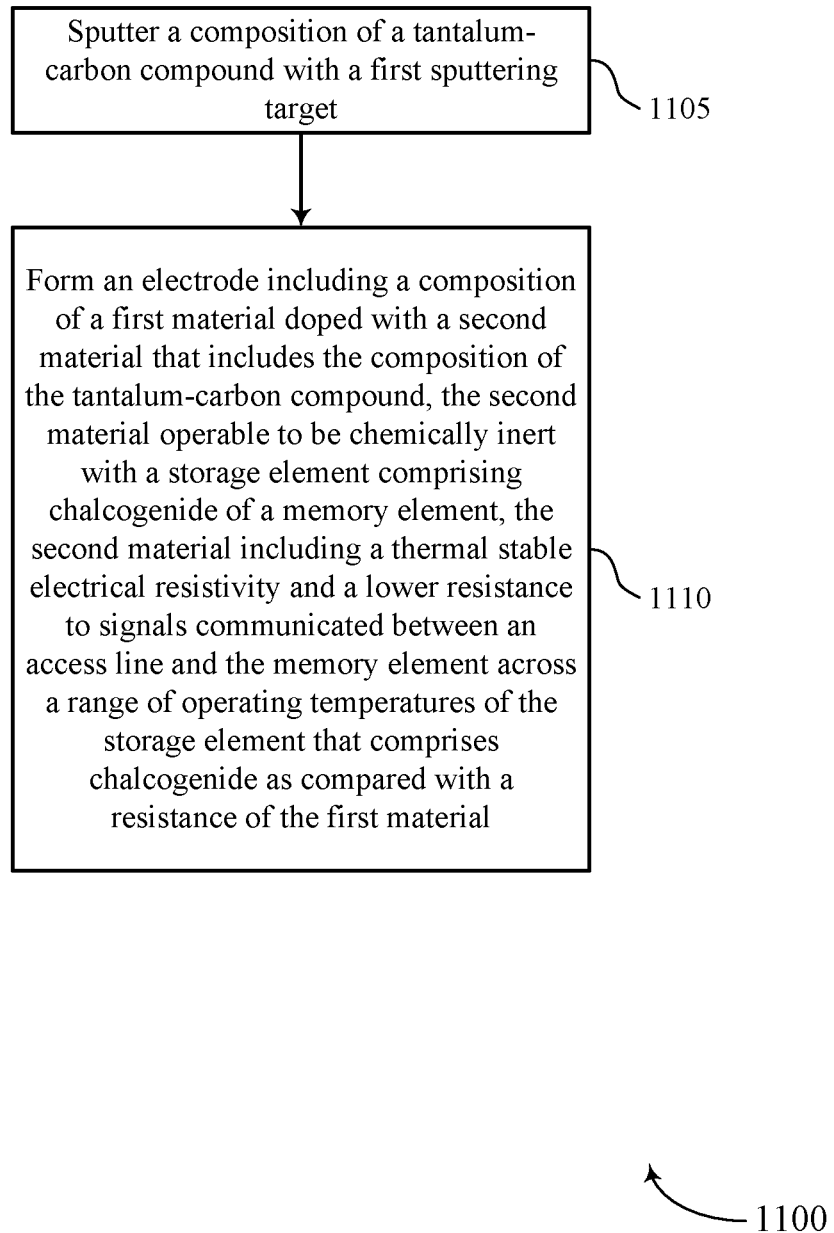
FIG. 11 shows a flowchart illustrating a method or methods that support composite electrode material chemistry in accordance with examples as disclosed herein.

FIG. 11 shows a flowchart illustrating a method or methods 1100 that supports composite electrode material chemistry in accordance with examples as disclosed herein. The operations of method 1100 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 1105, the method 1100 may include sputtering a composition of a tantalum-carbon compound with a first sputtering target. The operations of 1105 may be performed according to the methods described herein.

At 1110, the method 1100 may include forming an electrode including a composition of a first material doped with a second material that includes the composition of the tantalum-carbon compound, the second material operable to be chemically inert with a storage element including chalcogenide of a memory element, the second material including a thermally stable electrical resistivity and a lower resistance to signals communicated between an access line and the memory element across a range of operating temperatures of the storage element that includes chalcogenide as compared with a resistance of the first material. The operations of 1110 may be performed according to the methods described herein.

In some examples, the method 1100 may include features, means, or instructions (e.g., a non-transitory computer-readable medium storing instructions executable by a processor) for sputtering a composition of a tantalum-carbon compound with a first sputtering target and forming an electrode including a composition of a first material doped with a second material that includes the composition of the tantalum-carbon compound, the second material operable to be chemically inert with a storage element including chalcogenide of a memory element, the second material including a thermally stable electrical resistivity and a lower resistance to signals communicated between an access line and the memory element across a range of operating temperatures of the storage element that includes chalcogenide as compared with a resistance of the first material.

In some examples, sputtering the composition of the tantalum-carbon compound further may include operations, features, means, or instructions for depositing, on a substrate, carbon, and depositing, on the substrate, tantalum at a same time as depositing the carbon. Some examples of the method 1100 may further include operations, features, means, or instructions for sputtering carbon with a second sputtering target different than the first sputtering target, where the first material of the composition of the electrode includes the carbon.

In some examples of the method 1100, sputtering the composition of the tantalum-carbon compound includes a first power density at which to deposit the composition with the first sputtering target and sputtering the carbon includes a second power density different than the first power density at which to deposit the carbon with the second sputtering target. Some examples of the method 1100 may further include operations, features, means, or instructions for applying a PVD process to a substrate provided to control a bond formation between the carbon and the composition of the tantalum-carbon compound.

In some examples of the method 1100, the first sputtering target may be powered by a DC power source. In some examples of the method 1100, the first sputtering target may be powered by a pulsed DC power source, where the pulsed DC power source may be configured to adjust a frequency at which to deposit the composition of the tantalum-carbon compound. It should be noted that the methods described herein are possible implementations, and that the operations and the steps may be rearranged or otherwise modified and that other implementations are possible. Furthermore, portions from two or more of the methods may be combined.

An apparatus is described. The apparatus may include an access line, a memory element including a storage element including chalcogenide, and an electrode coupled with the memory element and the access line and including a composition of a first material doped with a second material that includes a tantalum-carbon compound, the second material operable to be chemically inert with the storage element of the memory element, the second material including a thermally stable electrical resistivity and a lower resistance to signals communicated between the access line and the memory element across a range of operating temperatures of the storage element as compared with a resistance of the first material.

In some examples, the composition of the electrode may have a resistivity in a range of 0.1-10 mohm-cm across the range of operating temperatures of the storage element. In some examples, the first material includes carbon. In some examples, the first material includes carbon and tantalum. In some examples, the tantalum-carbon compound may be in an amount less than or equal to 10 at. % of the composition. In some examples, tantalum may be in an amount equal to 3.2 at. % of the composition. In some examples, tantalum may be in an amount equal to 3.4 at. % of the composition. In some examples, the tantalum-carbon compound may be in an amount less than or equal to 94.8 at. % of the composition.

Some examples of the apparatus may include a second electrode coupled with the memory element and the access line and including a composition of a third material doped with a fourth material that includes carbon, a tantalum-carbon compound, or both, the fourth material operable to be chemically inert with the storage element including chalcogenide of the memory element, the fourth material including a thermally stable electrical resistivity and a lower resistance to signals communicated between the access line and the memory element across the range of operating temperatures of the storage element as compared with a resistance of the third material.

Some examples of the apparatus may include an interface layer coupled with the electrode and including carbon, the interface layer operable to provide a lower resistance to signals communicated between the access line and the memory element across the range of operating temperatures of the storage element as compared with the resistance of the first material. In some examples, the interface layer may be coupled between the memory element and the electrode. In some examples, the interface layer may be coupled between the memory element and the access line.

An apparatus is described. The apparatus may include a memory element including a storage element that includes chalcogenide, a first electrode coupled with the memory element and a first access line and including a composition of a first material doped with a second material that includes a tantalum-carbon compound, the second material operable to be chemically inert with the storage element of the memory element, the second material including a thermally stable electrical resistivity and a lower resistance to signals communicated between the first access line and the memory element across a range of operating temperatures of the storage element as compared with a resistance of the first material, and a second electrode coupled with the memory element and a second access line and including a composition of a third material doped with a fourth material that comprises carbon, the fourth material operable to be chemically inert with the storage element of the memory element, the fourth material including a thermally stable electrical resistivity and a lower resistance to signals communicated between the second access line and the memory element across the range of operating temperatures of the storage element as compared with a resistance of the third material.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

A transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   sputtering a composition of a tantalum-carbon compound with a first sputtering target; and
   forming an electrode comprising a composition of a first material doped with a second material that comprises the composition of the tantalum-carbon compound, wherein the composition of the first material doped with the second material at a first end of the electrode is different than the composition of the first material doped with the second material at a second end of the electrode, the second end of the electrode coupled with a storage element comprising chalcogenide, the second end of the electrode being chemically inert with the storage element, the second end of the electrode associated with a thermal stable electrical resistivity for signals communicated between an access line and the storage element via the electrode.

2. The method of claim 1, wherein sputtering the composition of the tantalum-carbon compound further comprises:
   depositing, on a substrate, carbon; and
   depositing, on the substrate, tantalum at a same time as depositing the carbon.

3. The method of claim 1, further comprising:
   sputtering carbon with a second sputtering target different than the first sputtering target, wherein the first material of the composition of the electrode comprises the carbon.

4. The method of claim 3, wherein sputtering the composition of the tantalum-carbon compound comprises a first power density at which to deposit the composition with the first sputtering target and wherein sputtering the carbon comprises a second power density different than the first power density at which to deposit the carbon with the second sputtering target.

5. The method of claim 3, further comprising:
   applying a physical vapor deposition (PVD) process to a substrate provided to control a bond formation between the carbon and the composition of the tantalum-carbon compound.

6. The method of claim 5, wherein the first sputtering target is powered by a DC power source.

7. The method of claim 5, wherein the first sputtering target is powered by a pulsed DC power source, wherein the pulsed DC power source is configured to adjust a frequency at which to deposit the composition of the tantalum-carbon compound.

\* \* \* \* \*